United States Patent
Nagasaki et al.

(10) Patent No.: US 12,396,350 B2
(45) Date of Patent: Aug. 19, 2025

(54) DISPLAY APPARATUS, PHOTOELECTRIC CONVERSION APPARATUS, ELECTRIC EQUIPMENT, ILLUMINATION APPARATUS, MOVING BODY, AND WEARABLE DEVICE

(71) Applicant: CANON KABUSHIKI KAISHA, Tokyo (JP)

(72) Inventors: Mizuki Nagasaki, Kanagawa (JP); Hiromasa Tsuboi, Tokyo (JP); Shoji Kono, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 17/893,305

(22) Filed: Aug. 23, 2022

(65) Prior Publication Data
US 2023/0061540 A1     Mar. 2, 2023

(30) Foreign Application Priority Data
Aug. 26, 2021    (JP) .................. 2021-138252

(51) Int. Cl.
*H10K 59/13*    (2023.01)
*H10K 59/121*   (2023.01)
*H10K 59/35*    (2023.01)

(52) U.S. Cl.
CPC ....... *H10K 59/353* (2023.02); *H10K 59/1216* (2023.02); *H10K 59/13* (2023.02)

(58) Field of Classification Search
CPC ... H10K 59/353; H10K 59/13; H10K 59/1216
See application file for complete search history.

(56) References Cited

U.S. PATENT DOCUMENTS

| | | | |
|---|---|---|---|
| 10,818,232 B2 | 10/2020 | Tsuboi et al. |
| 10,867,561 B2 | 12/2020 | Ota et al. |
| 10,998,392 B2 | 5/2021  | Tsuboi |
| 11,087,680 B2 | 8/2021  | Tsuboi |
| 11,120,728 B2 | 9/2021  | Nagasaki et al. |
| 11,282,453 B2 | 3/2022  | Tsuboi et al. |
| 11,393,430 B2 | 7/2022  | Nagasaki et al. |

(Continued)

FOREIGN PATENT DOCUMENTS

| JP | 2004-045636 A | 2/2004 |
| JP | 2006-251201 A | 9/2006 |

(Continued)

OTHER PUBLICATIONS

May 30, 2025 Japanese Official Action in Japanese Patent Appln. No. 2021-138252.

*Primary Examiner* — Eric K Ashbahian
(74) *Attorney, Agent, or Firm* — Venable LLP

(57) ABSTRACT

A display apparatus comprising a substrate in which a plurality of pixels are arranged is provided. Each of the plurality of pixels comprises a light emitting element arranged above a first surface of the substrate, and a light receiving element arranged between the first surface and a second surface of the substrate on an opposite side of the first surface. The light emitting element comprises a first electrode, a second electrode arranged between the first surface and the first electrode, and a light emitting layer arranged between the first electrode and the second electrode. In an orthogonal projection with respect to the first surface, the second electrode and the light receiving element at least partially overlap each other.

25 Claims, 21 Drawing Sheets

(56) References Cited

U.S. PATENT DOCUMENTS

| | | |
|---|---|---|
| 2005/0253790 A1 | 11/2005 | Uchida |
| 2009/0321751 A1* | 12/2009 | Miyao ................ B41J 2/451 257/E33.076 |
| 2010/0224880 A1* | 9/2010 | Kimura ............. H01L 29/7869 257/E33.053 |
| 2014/0240370 A1 | 8/2014 | Sakairi |
| 2016/0240133 A1 | 8/2016 | Gelinck |
| 2017/0032728 A1* | 2/2017 | Shima ................ G06F 3/0412 |
| 2019/0068929 A1* | 2/2019 | Sato ................... H04N 25/133 |
| 2019/0267421 A1 | 8/2019 | Suzuki |
| 2020/0126481 A1 | 4/2020 | Tsuboi |
| 2020/0212137 A1 | 7/2020 | Wang |
| 2021/0043692 A1* | 2/2021 | Cha .................... H10K 50/865 |
| 2021/0111227 A1 | 4/2021 | Tsuboi |
| 2021/0134896 A1* | 5/2021 | Guo ..................... H10K 59/65 |
| 2021/0225962 A1* | 7/2021 | Wang .................. H10K 59/131 |
| 2021/0233984 A1* | 7/2021 | Wang ................... H10K 59/13 |
| 2021/0280645 A1* | 9/2021 | Wang ................... H10K 59/353 |
| 2021/0313384 A1 | 10/2021 | Tada |
| 2021/0384280 A1 | 12/2021 | Akiyama et al. |
| 2022/0223120 A1 | 7/2022 | Tsuboi et al. |
| 2022/0230585 A1 | 7/2022 | Komazawa et al. |
| 2023/0055663 A1* | 2/2023 | Zhang ................. H10K 50/115 |
| 2023/0345794 A1* | 10/2023 | Hai ....................... H10K 39/34 |
| 2024/0196675 A1* | 6/2024 | Kimura ................ H10K 59/65 |
| 2024/0242696 A1* | 7/2024 | Mase ................... G09G 5/377 |
| 2024/0381737 A1* | 11/2024 | Ikeda ................... H05B 33/22 |

FOREIGN PATENT DOCUMENTS

| | | |
|---|---|---|
| JP | 2011-040454 A | 2/2011 |
| JP | 2014-194517 A | 10/2014 |
| JP | 2016-538583 A | 12/2016 |
| JP | 2018-174246 A | 11/2018 |
| JP | 2019-149475 A | 9/2019 |
| JP | 2020-102555 A | 7/2020 |

* cited by examiner

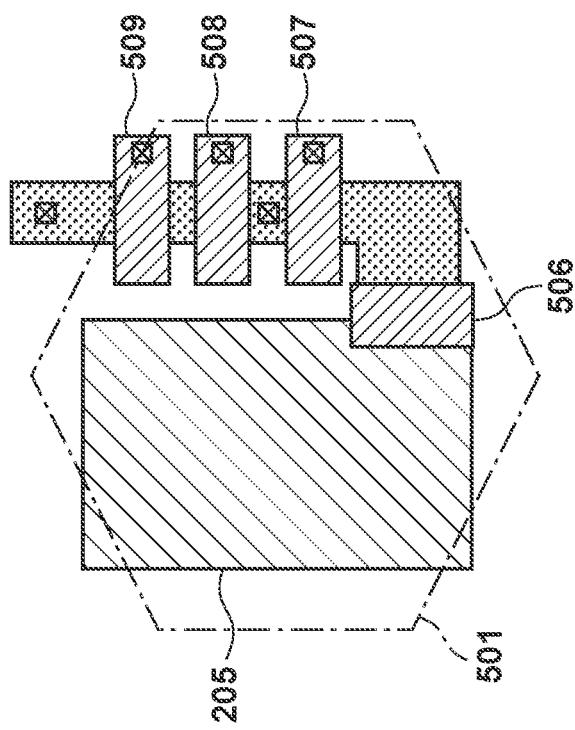
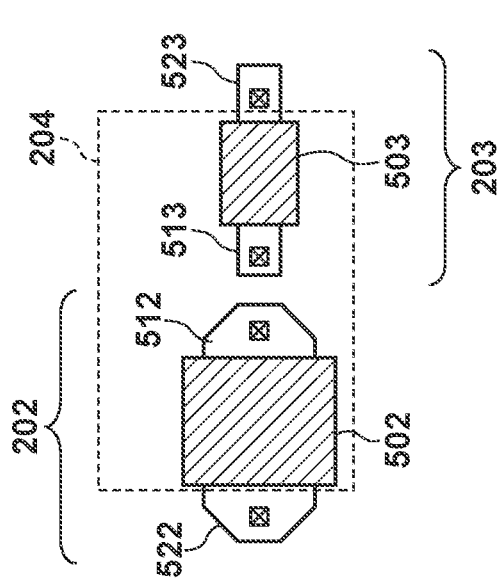
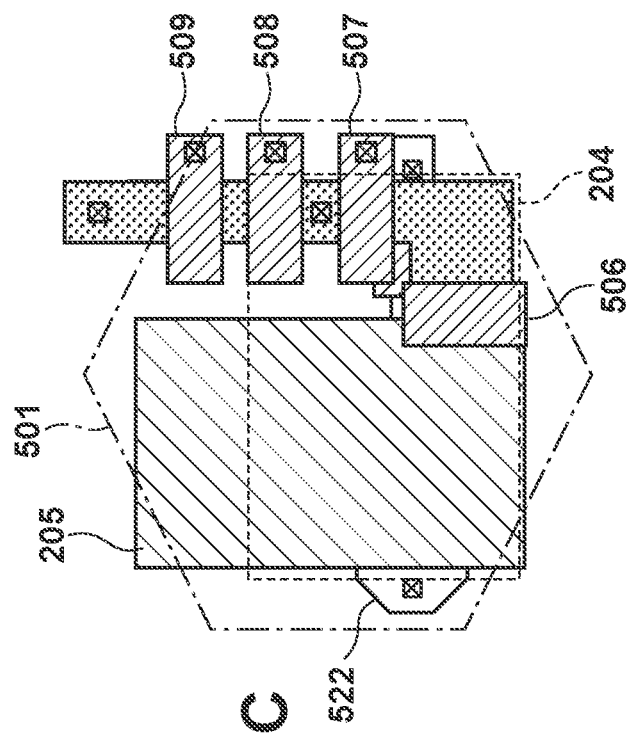
FIG. 12A
FIG. 12B
FIG. 12C

DISPLAY APPARATUS, PHOTOELECTRIC CONVERSION APPARATUS, ELECTRIC EQUIPMENT, ILLUMINATION APPARATUS, MOVING BODY, AND WEARABLE DEVICE

BACKGROUND OF THE INVENTION

Field of the Invention

The present invention relates to a display apparatus, a photoelectric conversion apparatus, an electric equipment, an illumination apparatus, a moving body, and a wearable device.

Description of the Related Art

There is an increasing interest in a display apparatus that uses a self-luminous light emitting element such as an organic electroluminescence (EL) element. Due to an image displayed on the display apparatus, a deterioration distribution of the light emitting element may be generated in a display region. Japanese Patent Laid-Open No. 2006-251201 describes that a light emitting element also functions as a light receiving element and detects the light emission amount of an adjacent light emitting element, and input video data for causing the light emitting element to emit light is corrected based on the detected light reception signal.

When using a light emitting element as a light receiving element, due to an influence of light entering from the outside, the correction effect may be decreased.

SUMMARY OF THE INVENTION

Some embodiments of the present invention provide a technique advantageous in detecting the luminance of a light emitting element.

According to some embodiments, a display apparatus comprising a substrate in which a plurality of pixels are arranged, wherein each of the plurality of pixels comprises a light emitting element arranged above a first surface of the substrate, and a light receiving element arranged between the first surface and a second surface of the substrate on an opposite side of the first surface, the light emitting element comprises a first electrode, a second electrode arranged between the first surface and the first electrode, and a light emitting layer arranged between the first electrode and the second electrode, and in an orthogonal projection with respect to the first surface, the second electrode and the light receiving element at least partially overlap each other, is provided.

Further features of the present invention will become apparent from the following description of exemplary embodiments (with reference to the attached drawings).

BRIEF DESCRIPTION OF THE DRAWINGS

FIGS. 12A to 12C are plan views showing an arrangement example of the pixel of the display apparatus shown in FIG. 1;

DESCRIPTION OF THE EMBODIMENTS

Figure 1:
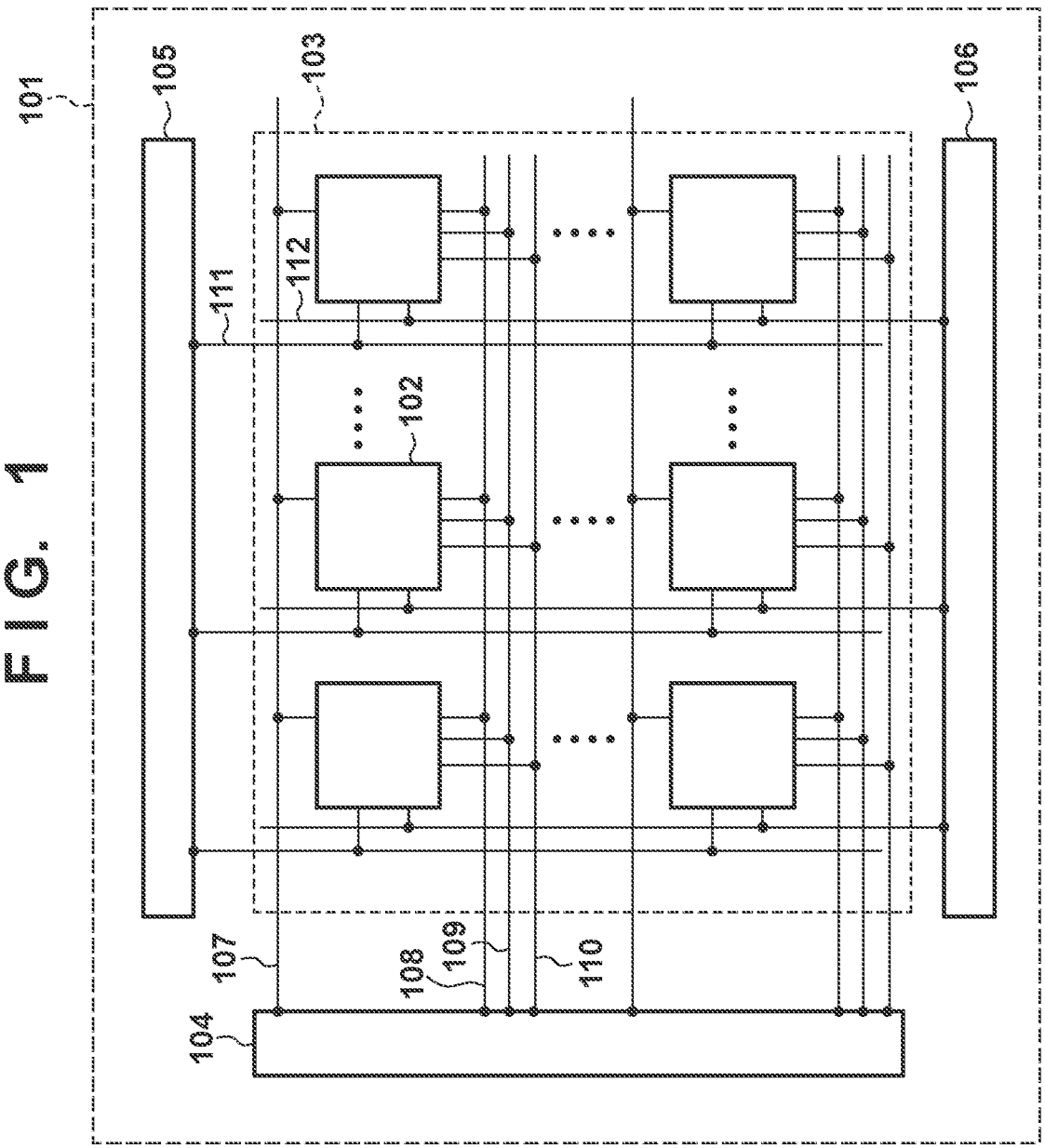
FIG. 1 is a view showing an arrangement example of a display apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1 to 15, a display apparatus according to an embodiment of the present disclosure will be described. FIG. 1 is a schematic view showing an arrangement example of a display apparatus 101 of this embodiment. As shown in FIG. 1, the display apparatus 101 includes a pixel array 103, and a driving circuit arranged around the pixel array 103. The pixel array 103 includes a plurality of pixels 102 two-dimensionally arranged in a matrix. Each of the plurality of pixels 102 includes a light emitting element and a light receiving element. Although details will be described with reference to FIG. 2, in this embodiment, the light emitting element is a self-luminous element such as an organic EL element. In this case, a light emitting element 201 includes an organic layer including a light emitting layer between an anode and a cathode. The organic layer may include, in addition to the light emitting layer, one or more of a hole injection layer, a hole transport layer, an electron injection layer, and an electron transport layer, as appropriate.

The driving circuit is a circuit for driving each pixel 102. The driving circuit includes, for example, a vertical scanning circuit 104, a signal output circuit 105, and a readout circuit 106. In the pixel array 103, scanning lines 107 to 110 are arranged for each pixel row along a row direction (a lateral direction in FIG. 1). Further, in the pixel array 103, a signal line 111 and a vertical output line 112 are arranged for each pixel column along a column direction (a vertical direction in FIG. 1).

Each of the scanning lines 107 to 110 is connected to an output terminal of the vertical scanning circuit 104 in a corresponding pixel row. Each signal line 111 is connected to an output terminal of the signal output circuit 105 in a corresponding pixel column. Each vertical output line 112 is connected to an input terminal of the readout circuit 106 in a corresponding pixel row.

When writing a video signal to each pixel 102 arranged in the pixel array 103, a control signal is input from the vertical scanning circuit 104 to the scanning line 107. Further, when writing the video signal to the pixel 102, the signal output circuit 105 outputs a luminance signal having a voltage corresponding to luminance information.

When a signal is output from each pixel 102 arranged in the pixel array 103, the vertical scanning circuit 104 supplies various kinds of control signals to the scanning lines 108 to 110. The pixel 102 connected to the scanning lines 108 to 110 supplied with the control signals outputs a pixel signal to the corresponding vertical output line 112. When the vertical scanning circuit 104 sequentially inputs the control signals to the scanning lines 108 to 110, the pixel signals are sequentially output from the respective pixels 102 to the vertical output lines 112.

Figure 2:
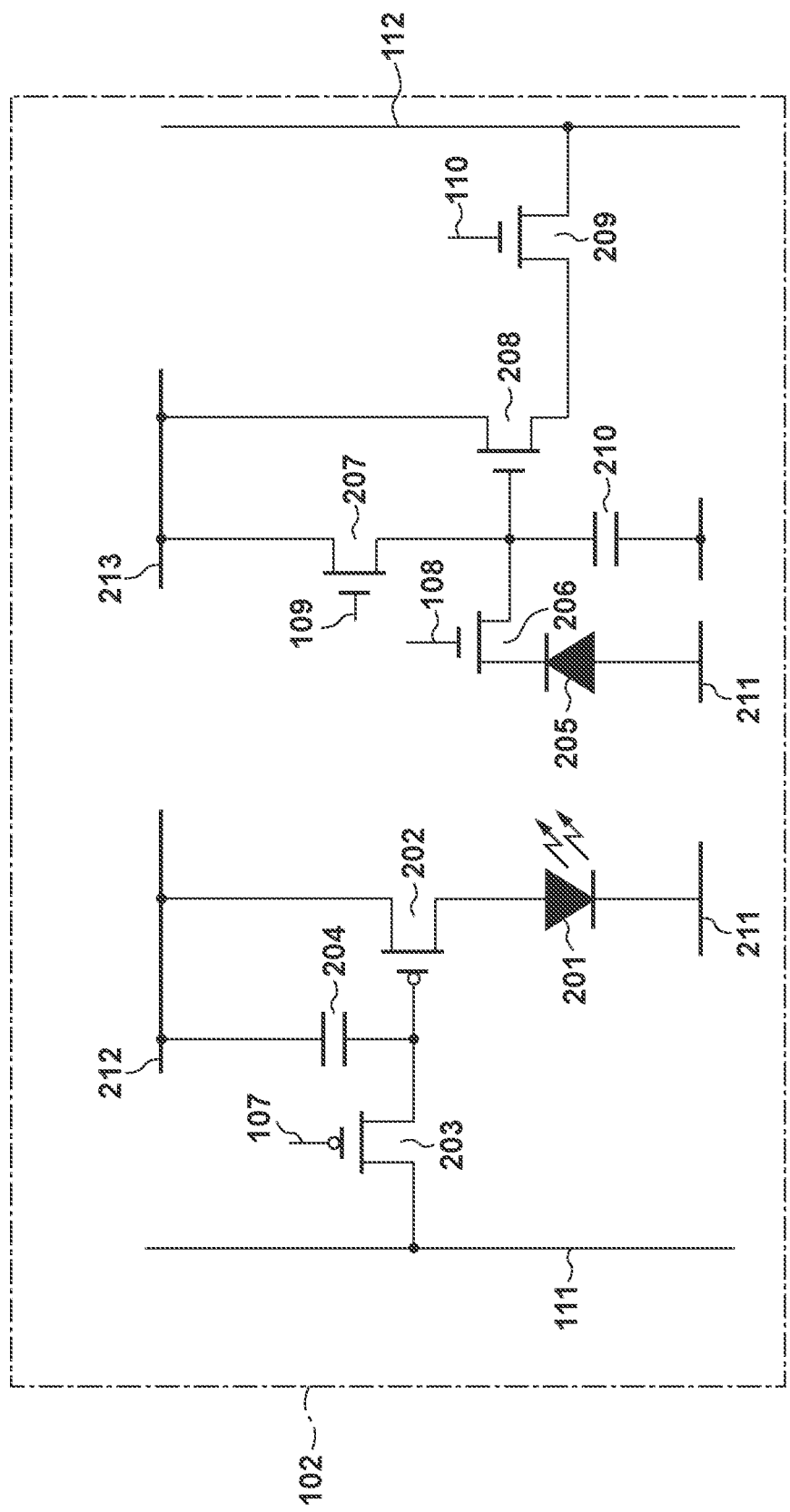
FIG. 2 is a circuit diagram showing an arrangement example of a pixel of the display apparatus shown in FIG. 1.

FIG. 2 is a circuit diagram showing an arrangement example of the pixel 102 arranged in the display apparatus 101 shown in FIG. 1. As shown in FIG. 2, the pixel 102 includes the light emitting element 201, a driving transistor 202, a writing transistor 203, a capacitive element 204, a light receiving element 205, a transfer transistor 206, a reset transistor 207, an amplification transistor 208, and a selection transistor 209. Here, a circuit including the driving transistor 202, the writing transistor 203, and the capacitive element 204, which are arranged to drive the light emitting element 201, is sometimes referred to as a light emitting circuit. Further, a circuit including a transfer transistor 206, the reset transistor 207, the amplification transistor 208, and the selection transistor 209, which are arranged to drive the light receiving element 205, is sometimes referred to as a light receiving circuit.

In this embodiment, a case will be described in which the driving transistor 202 is connected to an anode of the light emitting element 201, all transistors related to driving of the light emitting element 201 are p-type transistors, and all transistors related to driving of the light receiving element 205 are n-type transistors. However, the combination of the transistors is not limited to the arrangement shown in FIG. 2. The polarity and conductivity type of each of the light emitting element, the light receiving element, and the transistors may be reversed for some or all of them. The potential to be supplied and the connection may be changed as appropriate in accordance with the polarity and conductivity type of each of the light emitting element, the light receiving element, and the transistors. That is, the total number of the transistors and the capacitive element and the combination of the conductivity types of the transistors are merely examples, and can be changed as appropriate in accordance with specifications required for the display apparatus 101.

Here, in this specification, the expression that "a transistor is connected between an element A and an element B" represents a state in which one (a source or a drain) of two main terminals of the transistor is connected to the element A and the other of the two main terminals is connected to the element B. That is, the expression that "a transistor is connected between an element A and an element B" does not include a case in which a control terminal (gate electrode) of the transistor is connected to at least one of the element A and the element B.

As a specific arrangement of the pixel 102, one of two main terminals of the driving transistor 202 is connected to one (anode) of two main terminals of the light emitting element 201. The other of the two main terminals of the driving transistor 202 is connected to a power supply potential 212 (for example, Vdd). Accordingly, it can be said that the driving transistor 202 is connected between the light emitting element 201 and the power supply potential 212. The other (cathode) of the two main terminals of the light emitting element 201 is connected to a power supply potential 211 (for example, Vss).

One of two main terminals of the writing transistor 203 is connected to a control terminal of the driving transistor 202, and the other is connected to the signal line 111. Accordingly, the writing transistor 203 is connected between the driving transistor 202 and the signal line 111. A control terminal of the writing transistor 203 is connected to the scanning line 107. The capacitive element 204, which holds a luminance signal (luminance signal voltage Vsig) corresponding to the luminance of light emission of the light emitting element 201, is connected between the control terminal of the driving transistor 202 and the other (source) of two main terminals.

One of two main terminals of the transfer transistor 206 is connected to one (cathode) of main terminals of the light receiving element 205, and the other is connected to a control terminal of the amplification transistor 208. One of two main terminals of the amplification transistor 208 is connected to a power supply potential 213, and the other is connected to one of two main terminals of the selection transistor 209. The power supply potential 213 may be the same potential (for example, Vdd) as the power supply potential 212, or may be different potential. One of two main terminals of the reset transistor 207 is connected to the control terminal of the amplification transistor 208 and the other of the two main terminals of the transfer transistor 206, and the other of the two main terminals of the reset transistor 207 is connected to the power supply potential 213. The other of the two main terminals of the selection transistor 209 is connected to the vertical output line 112, and a control terminal of the selection transistor 209 is connected to the scanning line 110. The other (the anode) of the two main terminals of the light receiving element 205 is connected to the power supply potential 211. A capacitance 210 (floating diffusion capacitance) is connected to a connection node between the control terminal of the amplification transistor 208 and the other of the two main terminals of the reset transistor 207. The capacitance 210 has a function as a holding portion of electric charges generated by the light receiving element 205. The capacitance 210 may be a parasitic capacitance of the transfer transistor 206, the reset transistor 207, the amplification transistor 208, or a wiring pattern connecting them. In FIG. 2, the capacitance 210 is shown as a capacitive element.

Figure 3:
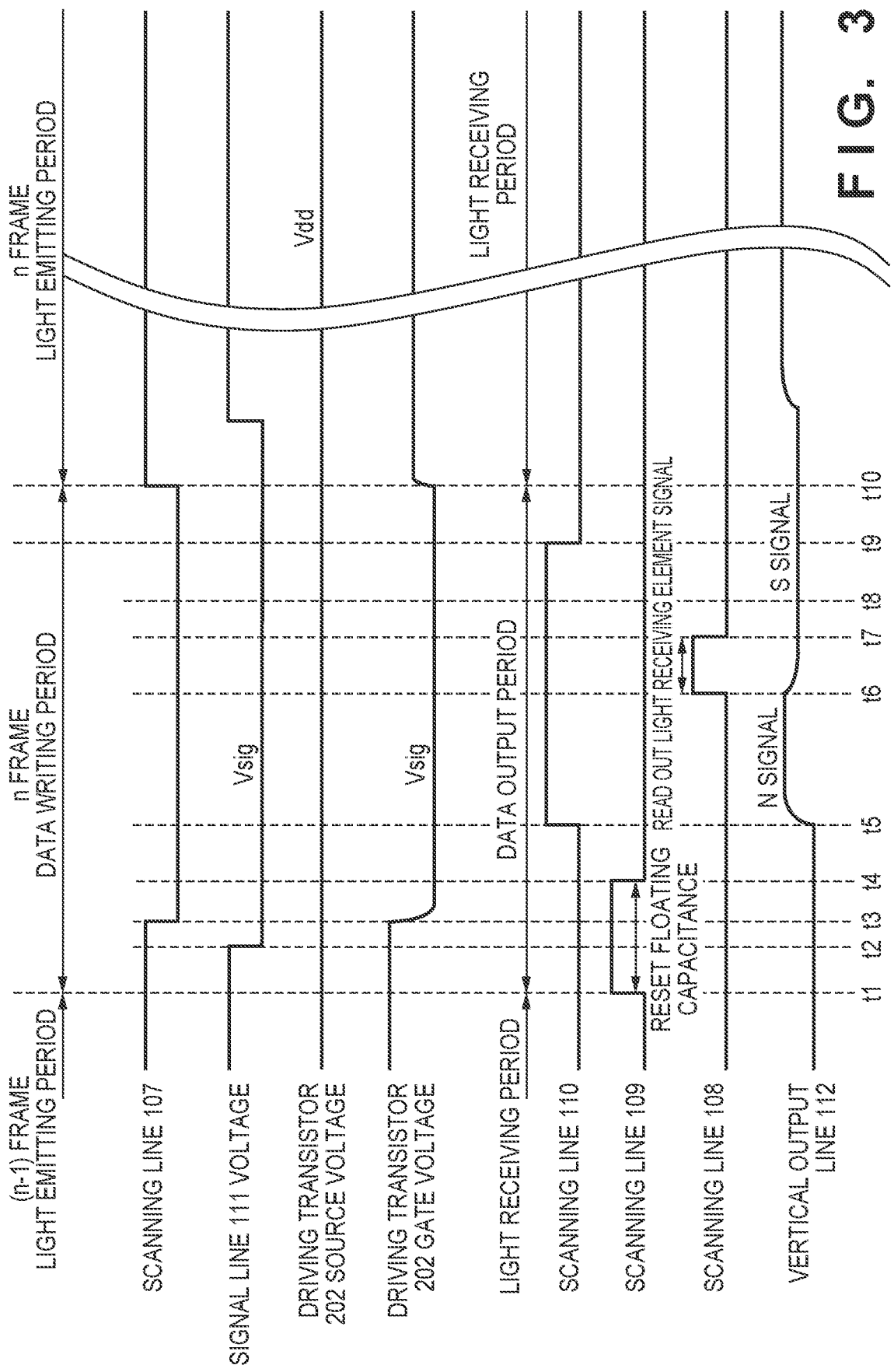
FIG. 3 is a timing chart in one horizontal scanning period of the display apparatus shown in FIG. 1.

FIG. 3 is a timing chart showing an operation example in one horizontal scanning period of the pixel 102 shown in FIG. 2. Here, FIG. 3 shows a line-sequential light emitting operation and a line-sequential light receiving operation. Periods before time t1 are a light emitting period of the light emitting element 201 and a light receiving period of the light receiving element 205 in the (n−1)th frame. From time t1 to time t10, writing of luminance information to the light emitting element 201 in the nth frame is performed, and the light receiving element 205 outputs, to the vertical output line 112, signal charges corresponding to the light emission amount of the light emitting element 201 in the (n−1)th frame.

At time t1, the vertical scanning circuit 104 makes the scanning line 109 transition from a Low signal to a High signal. This sets the reset transistor 207 in an ON state, and charges accumulated in the capacitance 210 are discharged to the power supply potential 213.

Then, at time t2, a luminance signal voltage Vsig corresponding to the luminance information is set to the signal line 111 from the signal output circuit 105.

When the luminance signal voltage Vsig is set to the signal line 111, at time t3, the vertical scanning circuit 104 makes the scanning line 107 transition from a High signal to a Low signal. This sets the writing transistor 203 in an ON state, and the luminance signal voltage Vsig is written to the control terminal of the driving transistor 202. With this, a driving current corresponding to the luminance signal voltage Vsig flows from the driving transistor 202 to the light emitting element 201.

Then, at time t4, the vertical scanning circuit 104 makes the scanning line 109 transition from the High signal to the Low signal. This sets the reset transistor 207 in an OFF state. With this, a reset of the capacitance 210 is completed.

When the reset of the capacitance 210 is completed, at time t5, the vertical scanning circuit 104 makes the scanning line 110 transition from a Low signal to a High signal. This sets the selection transistor 209 in an ON state, and the amplification transistor 208 and the vertical output line 112 are electrically connected to each other. With this, a reset potential (N signal) of the capacitance 210 buffered by the amplification transistor 208 is output to the vertical output line 112.

Then, at time t6, the vertical scanning circuit 104 makes the scanning line 108 transition from a Low signal to a High signal. This sets the transfer transistor 206 in an ON state, and electric charges accumulated in the light receiving element 205 are transferred to the capacitance 210. Since the light receiving element 205 photoelectrically converts and accumulates signal charges almost proportional to the light emission amount of the light emitting element 201, data used to correct a deterioration or defect of the light emitting element 201 can be acquired by reading out the electric charges of the light receiving element 205.

At time t7, the vertical scanning circuit 104 makes the scanning line 108 transition from the High signal to the Low signal. This sets the transfer transistor 206 in an OFF state. With this, transfer of electric charges to the capacitance 210 is completed.

At time t8, the signal charges accumulated in the light receiving element 205 are converted into a voltage (S signal) by the amplification transistor 208, and read out from the vertical output line 112. By calculating the difference between the N signal obtained at time t5 and the S signal, a signal with a noise component suppressed can be acquired.

Then, at time t9, the vertical scanning circuit 104 makes the scanning line 110 transition from the High signal to the Low signal. This sets the selection transistor 209 in an OFF state, and the electric connection between the vertical output line 112 and the amplification transistor 208 is disconnected.

At time t10, the vertical scanning circuit 104 makes the scanning line 107 transition from the Low signal to the High signal. This sets the writing transistor 203 in an OFF state, and writing of the luminance signal voltage Vsig to the control terminal of the driving transistor 202 is completed. The potential corresponding to the luminance signal voltage Vsig is held in the capacitive element 204 connected between the gate and source of the driving transistor 202.

Figure 4:
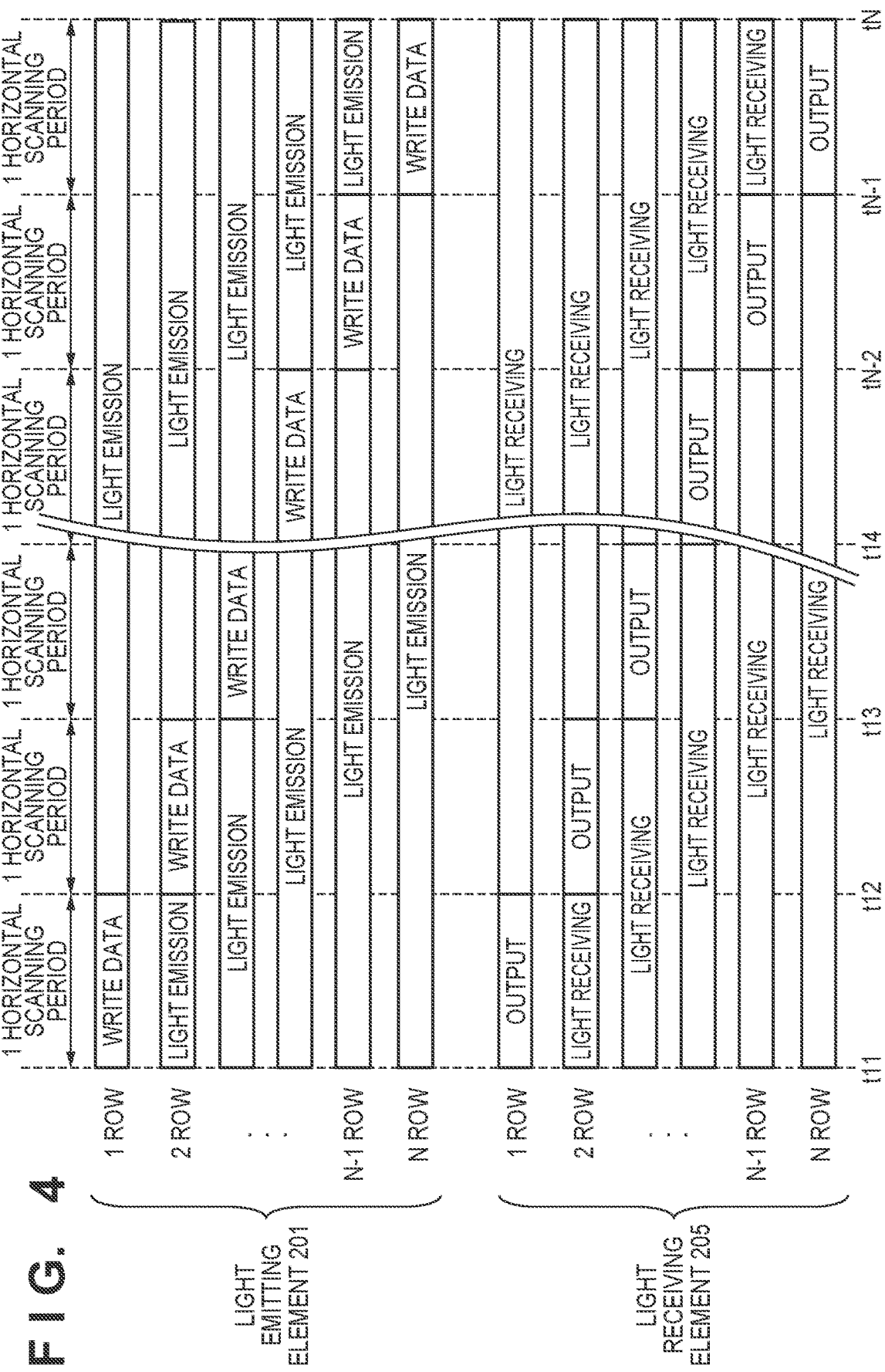
FIG. 4 is a timing chart in one vertical scanning period of the display apparatus shown in FIG. 1.

FIG. 4 is a timing chart showing an operation example in one vertical scanning period of the pixel 102 shown in FIG. 2. At time 11, writing of the luminance signal voltage Vsig to the light emitting element 201 arranged in the first row and reading out of the N signal and S signal from the light receiving element 205 arranged in the first row are performed. At each time from time t12 to time tN, similar to time t11, writing of the luminance signal voltage Vsig to the light emitting element 201 arranged in a corresponding row and reading out of the N signal and S signal from the light receiving element 205 arranged in the corresponding row are performed. Writing of the luminance signal voltage Vsig to the light emitting element 201 and reading out of the N signal and S signal from the light receiving element 205 are performed as described with reference to FIG. 3.

The signal output from the light receiving element 205 has a value almost corresponding to the light emission luminance of the light emitting element 201. Therefore, by comparing the luminance information to the light emitting element 201 input to the display apparatus 101 with the signal output from the light receiving element 205, information of a deterioration of the light emitting element 201, an uneven luminance in a surface of the pixel array 103, and the like can be acquired. By correcting data of the luminance information input to the display apparatus 101 using the information of the deterioration of the light emitting element 201, the uneven luminance, and the like, it is possible to display an image in which the deterioration of the light emitting element 201, the uneven luminance, and the like have been corrected. That is, it is possible to suppress a deterioration in image quality of the image displayed on the display apparatus 101.

In FIG. 4, the driven row of the light emitting element 201 and the driven row of the light receiving element 205 are in synchronization with each other, but the present invention is not limited to this. For example, in the display apparatus 101, when causing the light emitting element 201 to emit light at a high luminance, signal saturation may occur in the light receiving element 205 and correction data may not be obtained. In this case, the driving cycle of the light receiving element 205 may be made shorter than the driving cycle of the light emitting element 201 to shorten the signal accumulation time, thereby suppressing the signal saturation in the light receiving element 205.

Figure 5:
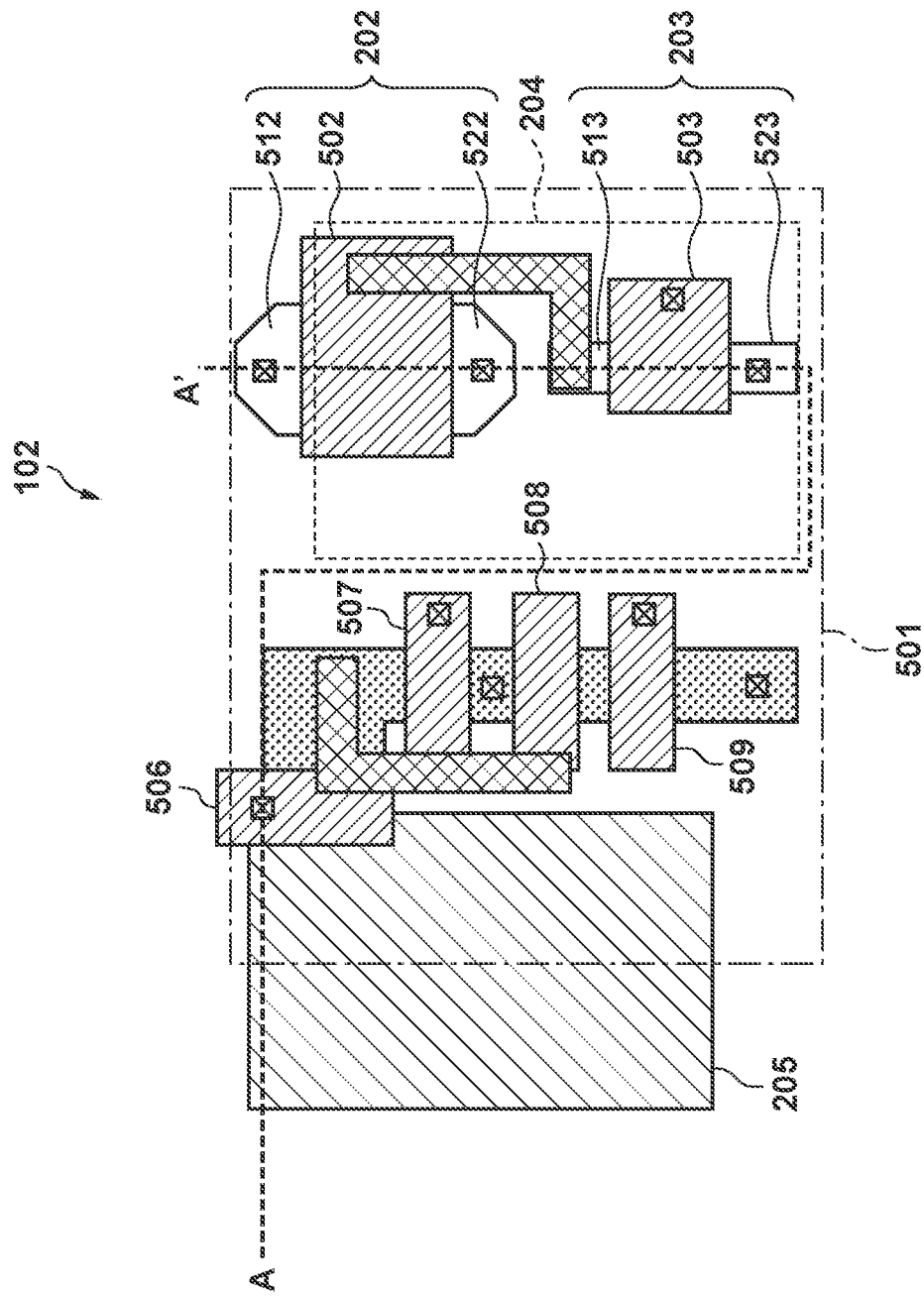
FIG. 5 is a plan view showing an arrangement example of the pixel of the display apparatus shown in FIG. 1.
Figure 6:
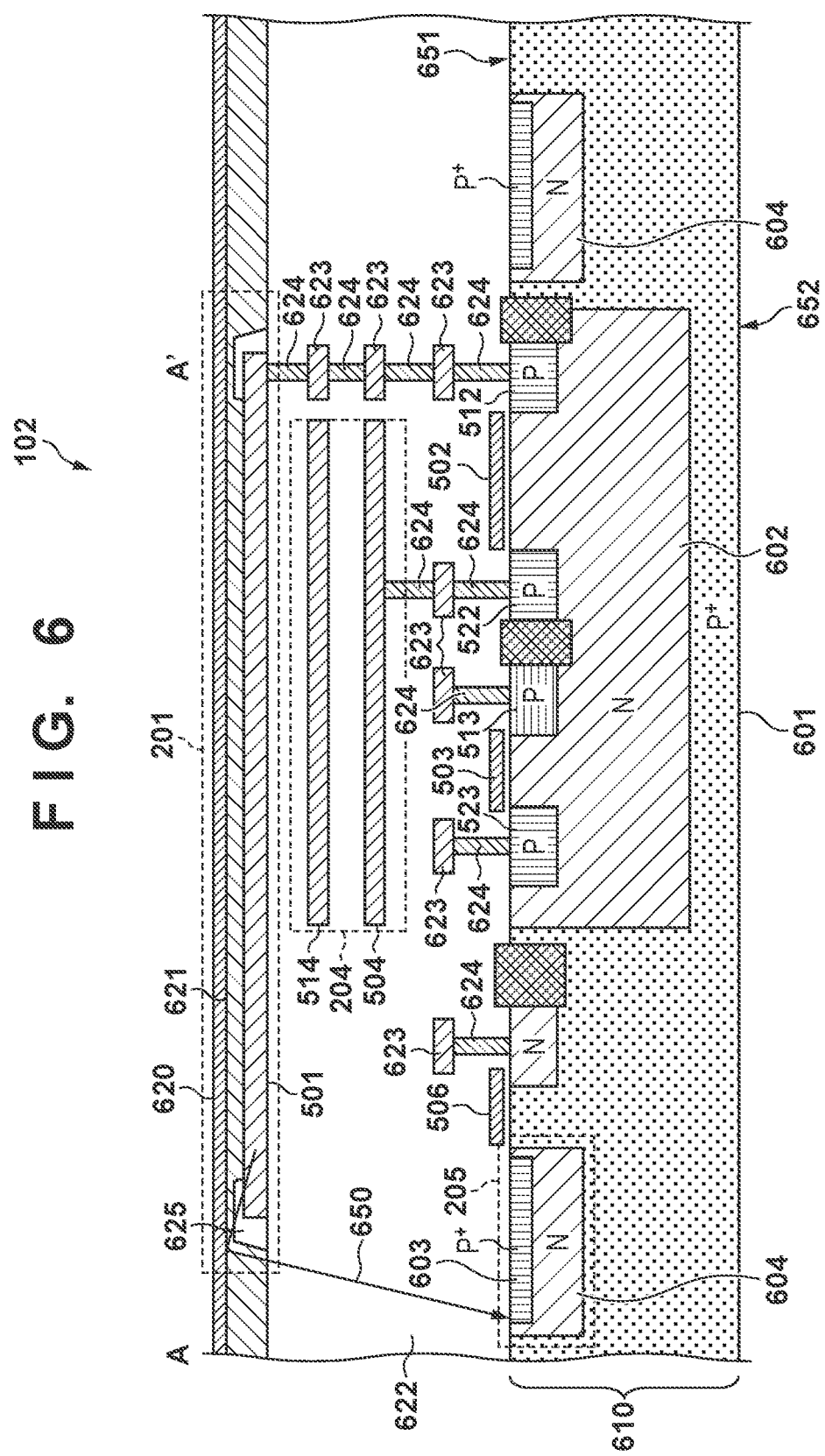
FIG. 6 is a sectional view showing the arrangement example of the pixel of the display apparatus shown in FIG. 1.

Next, the layout of the pixel 102 of the display apparatus 101 that performs the operation as described above will be described. FIGS. 5 and 6 are a plan view and a sectional view showing an arrangement example of the pixel 102, respectively. FIG. 6 shows a section taken along a line A-A' in the plan view of FIG. 5. FIG. 5 shows a plane layout of one pixel 102 alone, but in practice, the layout shown in FIG. 5 is periodically repeated at a predetermined pitch in the row direction and the column direction.

The driving transistor 202 is formed by including a gate electrode 502, a p-type diffusion layer 512 (drain), and a p-type diffusion layer 522 (source). The writing transistor 203 is formed by including a gate electrode 503, a p-type diffusion layer 513 (drain), and a p-type diffusion layer 523 (source). A gate electrode 506 indicates the gate electrode of the transfer transistor 206, a gate electrode 507 indicates the gate electrode of the reset transistor 207, a gate electrode 508 indicates the gate electrode of the amplification transistor 208, and a gate electrode 509 indicates the gate electrode of the selection transistor 209.

The pixel 102 is formed on a substrate 610. For example, a silicon substrate using silicon (Si) may be used as the substrate 610. As shown in FIG. 6, the light emitting element 201 is arranged above a surface 651 of two main surfaces of the substrate 610, and the light receiving element 205 is arranged between the surface 651 and a surface 652 on the opposite side of the surface 651.

The light receiving element 205 is an embedded photodiode formed in a $P^+$-well 601 of the substrate 610 and including a p-type semiconductor region 603 in contact with the surface 651 of the substrate 610, and an n-type semiconductor region 604 provided below the p-type semiconductor region 603. The semiconductor region 604 is an electric charge accumulation layer for accumulating signal charges (electrons) generated in the light receiving element 205.

An interlayer insulating film 622 is arranged on the surface 651 of the substrate 610. One or more metal wiring layers 623 are arranged in the interlayer insulating film 622. In the arrangement shown in FIG. 6, three metal wiring layers 623 are arranged. However, the present invention is not limited to this, and the number of the metal wiring layers 623 may be two or less, or four or more. Conductive plugs 624 are arranged, as appropriate, between the metal wiring layers 623, between the metal wiring layer 623 and the above-described transistor or the like formed in the substrate 610, and between the metal wiring layer 623 and the light emitting element 201, and electrically connected to each other. Various kinds of dielectric materials such as silicon oxide and silicon nitride are used for the interlayer insulating film 622. Not only a nonorganic material but also an organic material may be used in the interlayer insulating film 622. Different materials may be used for the interlayer insulating film 622 in accordance with the distance from the surface 651 of the substrate 610. That is, the interlayer insulating film 622 may have a stacked structure. For example, copper (Cu), tungsten (W), aluminum (Al), and the like are used for the metal wiring layer 623 and the conductive plug 624.

On the side of the surface 651 of the substrate 610, an n-type transistor (for example, the transfer transistor 206) for driving the light receiving element 205, and p-type transistors (for example, the driving transistor 202 and the writing transistor 203) for driving the light emitting element 201 formed in an n-type semiconductor well 602 are arranged. Each transistor may be a CMOS transistor formed by a general CMOS process.

The capacitive element 204 has a structure including the interlayer insulating film 622 (for example, a silicon oxide film) between an electrode 504 and an electrode 514. The electrode 504 is connected to the p-type diffusion layer 522 (source) of the driving transistor 202, and the electrode 514 is connected to the gate electrode 502 of the driving transistor 202.

The light emitting element 201 includes an electrode 620 (cathode), an electrode 501 (anode) arranged between the surface 651 of the substrate 610 and the electrode 620, and a light emitting layer 621 arranged between the electrode 620 and the electrode 501. As shown in FIG. 6, the electrode 620 and the light emitting layer 621 may be shared by multiple pixels 102. For example, the electrode 620 and the light emitting layer 621 may be integrally formed over the entire surface of the pixel array 103. On the other hand, the electrode 501 is arranged for each light emitting element 201 (pixel 102), and can be referred to as an individual electrode. The light emission position and light emission shape of the light emitting element 201 can be determined by the electrode 501 arranged for each light emitting element 201 (pixel 102). A transparent conductive material can be used for the electrode 620 to transmit light generated in the light emitting layer 621. As the transparent conductive material, a metal oxide such as tin oxide, zinc oxide, indium oxide, indium tin oxide (ITO), or indium zinc oxide can be used. For the electrode 501, for example, a metal material such as tungsten (W), aluminum (Al), platinum (Pt), or palladium (Pd) is used. The above-described interlayer insulating film 622 is arranged between the surface 651 of the substrate 610 and the electrode 501. Further, in this embodiment, a bank 625 formed of a dielectric is arranged so as to cover the outer edge of the electrode 501. The bank 625 suppresses that a current flowing between the electrode 501 and the electrode 620 leaks to the adjacent pixel 102.

As shown in FIGS. 5 and 6, in an orthogonal projection with respect to the surface 651 of the substrate 610, the electrode 501 and the light receiving element 205 at least partially overlap each other. By arranging the electrode 501 above the light receiving element 205 so as to overlap each other, an influence caused by external light entering the light receiving element 205 can be reduced. Light emitted by the light emitting element 201 includes a component which propagates to the outside (air) from the display apparatus 101, and a component which is reflected due to a reflective index difference between the light emitting layer 621 and the electrode 620 or between the electrode 620 and air (when a protection layer, a color filter, or the like exists on the electrode 620, between the electrode 620 and each layer) and returns to the light emitting layer 621 side. As shown in FIG. 6, part 650 of the reflected component (reflected light) passes through a region where the electrode 501 and the light receiving element 205 do not overlap each other in the orthogonal projection with respect to the surface 651 of the substrate 610, and enters the light receiving element 205. Since the part 650 of the reflected light corresponding to the luminance of the light emitting element 201 enters the light receiving element 205, a signal output corresponding to the luminance of the light emitting element 201 can be obtained from the light receiving element 205.

As described in Japanese Patent Laid-Open No. 2006-251201, when a light emitting element also functions as a light receiving element, for example, the light emitting element may be influenced by external light while it emits light at a low luminance, so the light emission amount of the light emitting element may not be accurately estimated. This can cause a degradation in accuracy of correction based on a detected signal. On the other hand, in this embodiment, in the orthogonal projection with respect to the surface 651 of the substrate 610, the electrode 501 and the light receiving element 205 overlap each other. In addition, in an orthogonal projection with respect to a surface (section) orthogonal to the surface 651 of the substrate 610, the light emitting element 201 and the light receiving element 205 do not overlap each other. Accordingly, it is possible to obtain a signal corresponding to the light emitted by the light emitting element 201 while suppressing an influence of external light entering the light receiving element 205. Further, in the arrangement shown in FIGS. 5 and 6, in the orthogonal projection with respect to the surface 651 of the substrate 610, the light receiving element 205 and the capacitive element 204 of the light emitting circuit are arranged at positions which do not overlap each other. Accordingly, of the light emitted by the light emitting element 201, the part 650 of the reflected light easily enters the light receiving element 205 as compared to a case in which the light receiving element 205 and the capacitive element 204 overlap each other. That is, by using the structure of the pixel 102 shown in this embodiment, it becomes possible to effectively perform correction of a deterioration of the light emitting element 201 and an uneven luminance in the surface of the pixel array 103. As a result, the image quality of a display image displayed on the display apparatus 101 can be improved.

Figure 7:
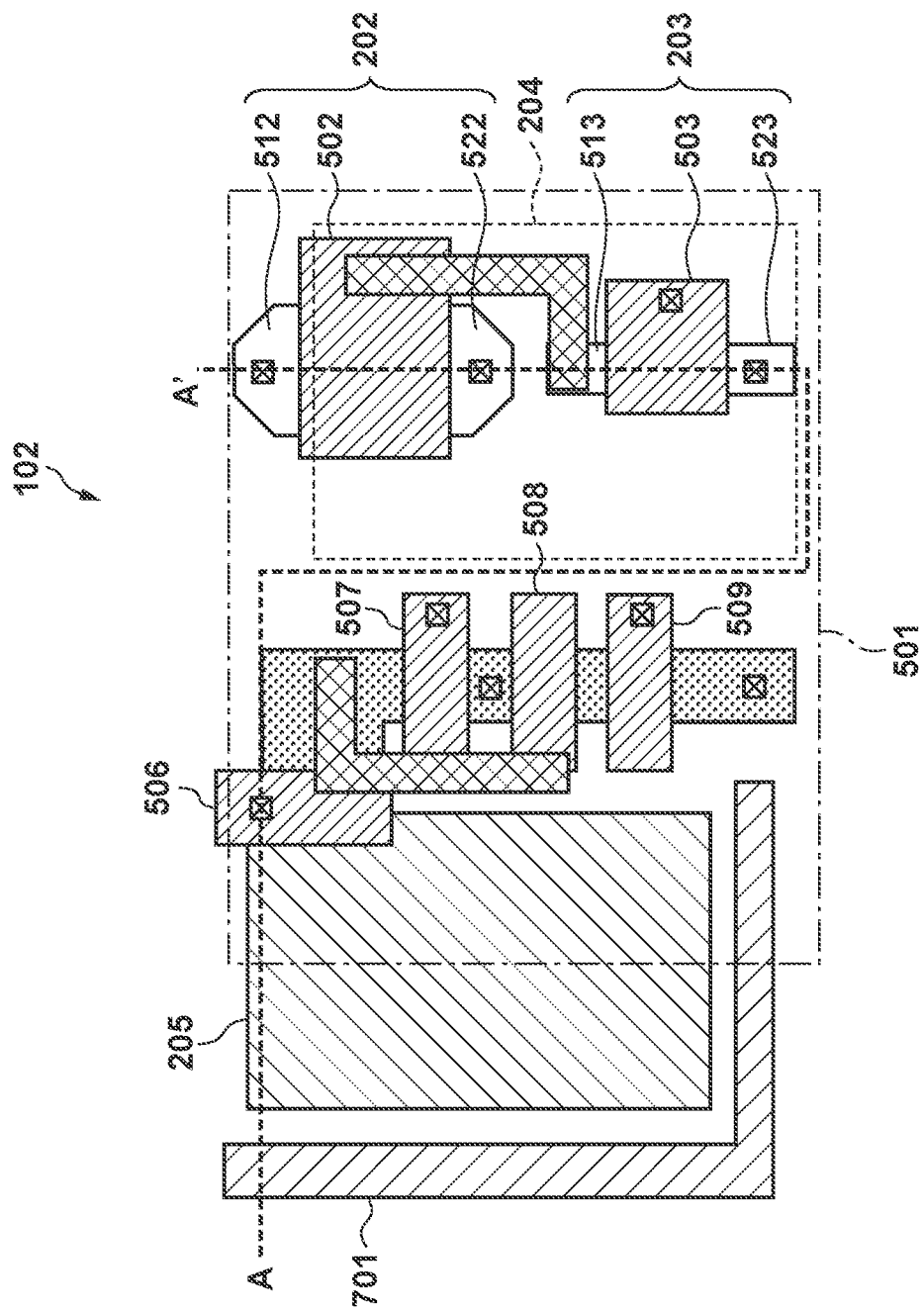
FIG. 7 is a plan view showing an arrangement example of the pixel of the display apparatus shown in FIG. 1.
Figure 8:
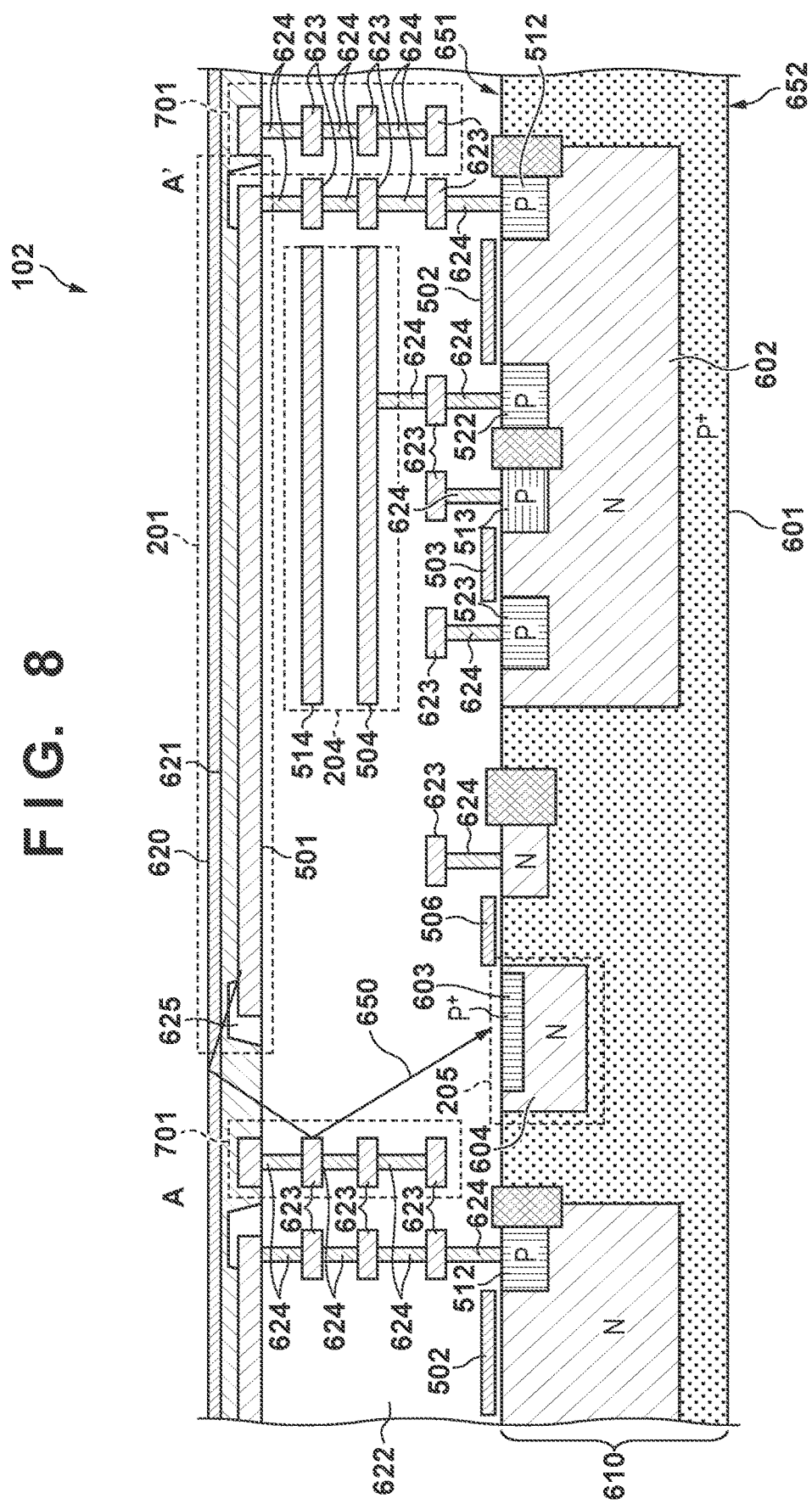
FIG. 8 is a sectional view showing the arrangement example of the pixel of the display apparatus shown in FIG. 1.

Next, with reference to FIGS. 7 and 8, a modification of the pixel 102 will be described. FIG. 7 is a plan view of the pixel 102, and FIG. 8 is a sectional view taken along a line A-A' in FIG. 7. A description will be given while focusing on the arrangement different from the layout shown in FIGS. 5 and 6. In the arrangement shown in FIGS. 5 and 6, the light receiving element 205 is arranged between the light emitting elements 201 adjacent to each other. Therefore, light from the adjacent light emitting element 201 may enter the light receiving element 205 and be detected by the light receiving element 205.

To prevent this, as shown in FIGS. 7 and 8, in an orthogonal projection with respect to the surface 651 of the substrate 610, a light shielding layer 701 is arranged in a region of the interlayer insulating film 622 which overlaps an outer edge portion of each pixel 102 of the plurality of pixels 102. By arranging the light shielding layer 701 between the pixels 102 adjacent to each other, an effect of reducing an optical crosstalk caused by light emitted by the light emitting element 201 entering the light receiving element 205 of the adjacent pixel 102 can be obtained.

The light shielding layer 701 can be formed of the same material as the materials of the metal wiring layer 623 and the conductive plug 624. That is, the light shielding layer 701 can be simultaneously formed when forming the metal wiring layer 623 and the conductive plug 624. By using the process as described above, an increase in the number of steps caused by providing the light shielding layer 701 can be suppressed. The light shielding layer 701 may be formed such that, in a direction crossing the surface 651 of the substrate 610, the conductive plugs 624 connect from the metal wiring layer 623 immediately above the substrate 610 to the pattern in the same layer as the electrode 501 of the light emitting element 201.

Figure 9:
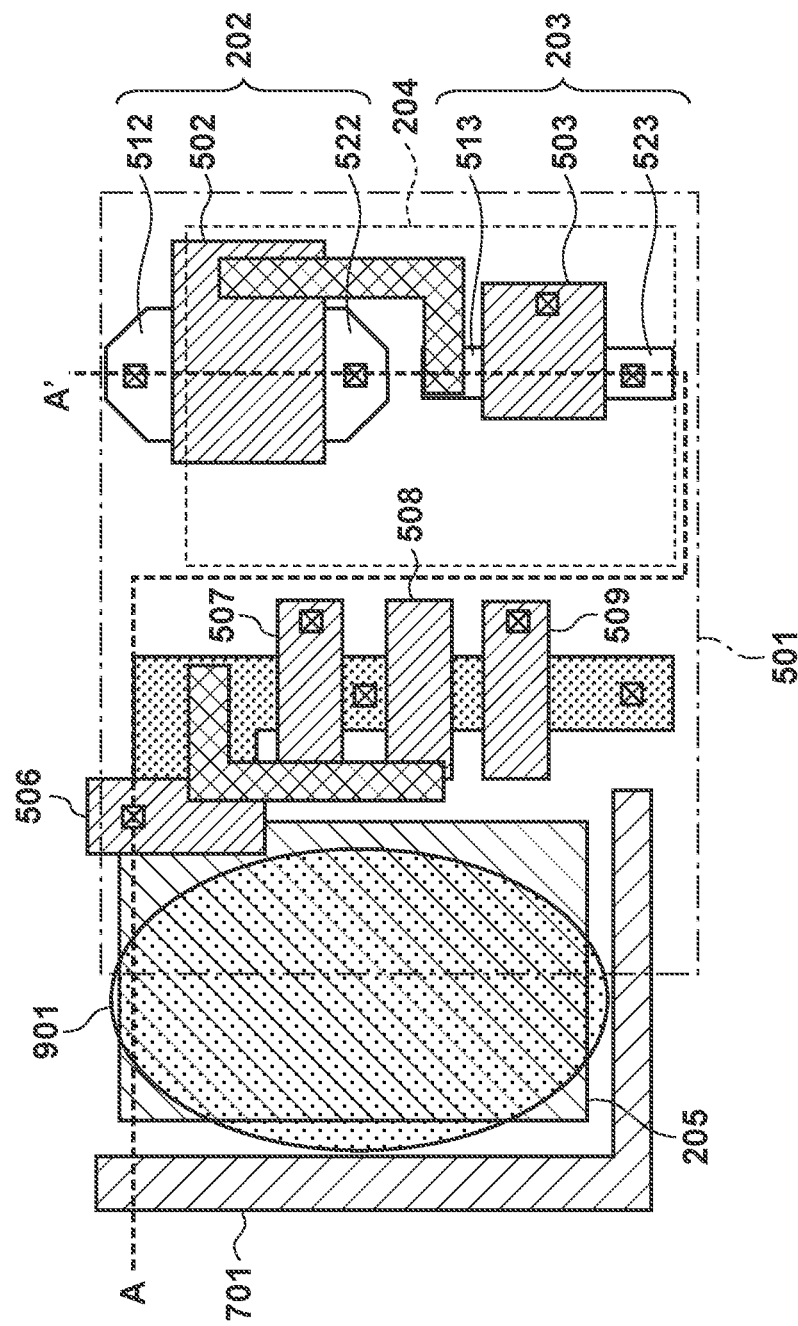
FIG. 9 is a plan view showing an arrangement example of the pixel of the display apparatus shown in FIG. 1.
Figure 10:
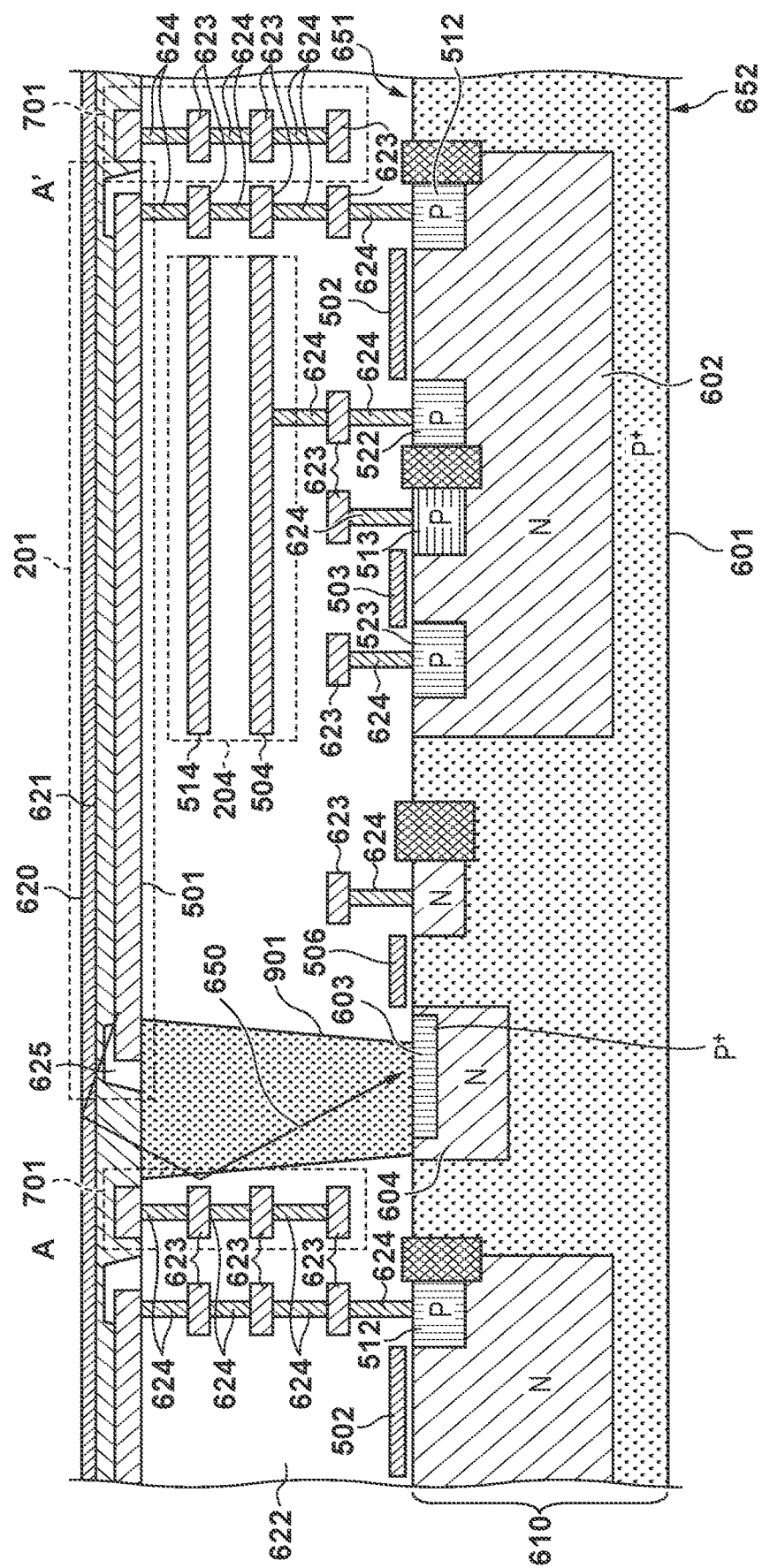
FIG. 10 is a sectional view showing the arrangement example of the pixel of the display apparatus shown in FIG. 1.

With reference to FIGS. 9 and 10, another modification of the pixel 102 will be described. FIG. 9 is a plan view of the pixel 102, and FIG. 10 is a sectional view taken along a line A-A' in FIG. 9. A description will be given while focusing on the arrangement different from the layout shown in FIGS. 7 and 8. In the arrangement shown in FIG. 7, it is possible to suppress an optical crosstalk between the pixels 102 adjacent to each other, but reflected light from the light shielding layer 701 may enter a region other than the light receiving element 205, and the sensitivity of the light receiving element 205 may decrease.

To prevent this, as shown in FIGS. 9 and 10, in an orthogonal projection with respect to the surface 651 of the substrate 610, an optical waveguide 901 is arranged in a region of the interlayer insulating film 622 which overlaps the light receiving element 205 in the pixel 102. The optical waveguide 901 is arranged such that a bottom portion on the side of the substrate 610 faces the light receiving element 205. The optical waveguide 901 is obtained by forming, into a conical trapezoid shape, a material having a higher refractive index than the surrounding interlayer insulating film 622, and has a function of guiding, to the light receiving element 205, the part 650 of reflected light of light emitted by the light emitting element 201. For example, when silicon oxide or the like is used for the interlayer insulating film 622, a material such as silicon nitride may be used for the optical waveguide 901.

By arranging the optical waveguide 901, it becomes possible to efficiently guide the light reflected by the light shielding layer 701 to the light receiving element 205. With this, the sensitivity of the light receiving element 205 to light emitted from the light emitting element 201 can be improved. As a result, an influence of external light to the light receiving element 205 can be reduced, so that the light emission luminance of the light emitting element 201 to be detected can be detected with a high accuracy.

In the structure of the pixel 102 described so far, the light emitting circuit for driving the light emitting element 201 and the light receiving circuit for driving the light receiving element 205 are arranged in one substrate 610. Since the light emitting circuit including the driving transistor 202 and the like and the light receiving circuit including the transfer transistor 206 and the like are arranged with respect to one substrate 610, miniaturization of the pixel 102 is limited. Now, achieving miniaturization of the pixel 102 by distributing and arranging the elements forming the light receiving circuit and the elements forming the light emitting circuit in two substrates will be described.

Figure 11:
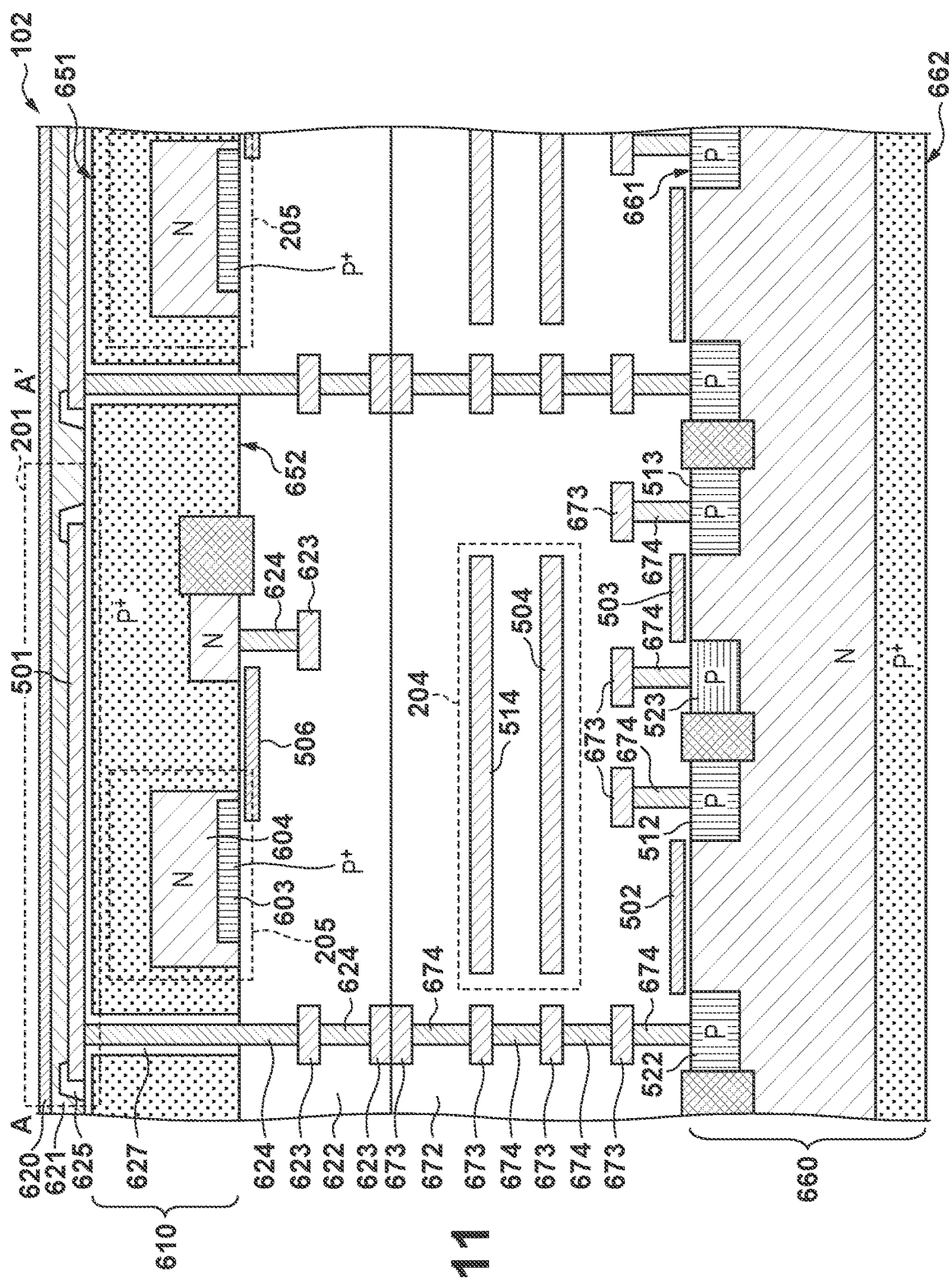
FIG. 11 is a sectional view an arrangement example of the pixel of the display apparatus shown in FIG. 1.

FIG. 11 is a sectional view of the pixel 102 of the display apparatus 101 having a structure in which two substrates including the substrate 610 and a substrate 660 are stacked on each other. As in the arrangement described above, for example, a silicon substrate using silicon (Si) is used as the substrate 610. As the substrate 660 arranged so as to face a surface 652 of the substrate 610, for example, silicon (Si), glass, or the like may be used. In this embodiment, similar to the substrate 610, a silicon substrate using silicon (Si) is used as the substrate 660.

The pixel 102 shown in FIG. 11 includes the light emitting element 201 arranged on the surface 651 of the substrate 610, and the light receiving element 205 arranged between the surface 651 and the surface 652 of the substrate 610. The light emitting element 201 includes the electrode 620, the electrode 501 arranged between the surface 651 of the substrate 610 and the electrode 620, and the light emitting layer 621 arranged between the electrode 620 and the electrode 501. As in the respective arrangements describe above, the electrode 620 and the light emitting layer 621 may be shared by multiple pixels 102, and the electrode 501 may be divided for each light emitting element 201 (pixel 102), as shown in FIG. 11. Further, as in the arrangements described above, the bank 625 formed of a dielectric may be arranged so as to cover the outer edge of the electrode 501. An interlayer insulating film 627, which makes the substrate 610 and the electrode 501 electrically independent of each other, can be arranged between the substrate 610 and the electrode 501.

The light receiving element 205 is arranged in the substrate 610. As shown in FIG. 11, the transfer transistor 206 is arranged on the surface 652 of the substrate 610. Also in this embodiment, in an orthogonal projection with respect to the surface 651 of the substrate 610, the electrode 501 and the light receiving element 205 at least partially overlap each other.

The interlayer insulating film 622 is arranged on the surface 652 of the substrate 610 on the side of the substrate 660, and one or more metal wiring layers 623 are arranged in the interlayer insulating film 622. The conductive plugs 624 are arranged, as appropriate, between the metal wiring layers 623, between the metal wiring layer 623 and the transistor or the like formed in the substrate 610, and between the metal wiring layer 623 and the light emitting element 201, and electrically connected to each other. The substrate 660 includes a surface 661 on the substrate 610 side of the substrate 660, and a surface 662 on the opposite side of the surface 661. An interlayer insulating film 672 is arranged on the surface 661 of the substrate 660, and one or more metal wiring layers 673 are arranged in the interlayer insulating film 672. Conductive plugs 674 are arranged, as appropriate, between the metal wiring layers 673, and between the metal wiring layer 673 and the transistor or the like formed in the substrate 660, and electrically connected to each other.

Various kinds of dielectric materials such as silicon oxide and silicon nitride are used for the interlayer insulating films 622 and 672. Not only a nonorganic material but also an organic material may be used for the interlayer insulating films 622 and 672. Different materials may be used for the interlayer insulating films 622 and 672 in accordance with the distance from the surface 651 of the substrate 610. That is, each of the interlayer insulating films 622 and 672 may have a stacked structure. For example, copper (Cu), tungsten (W), aluminum (Al) and the like are used for the metal wiring layers 623 and 673 and the conductive plugs 624 and 674.

The metal wiring layer 623 of the substrate 610 and the metal wiring layer 673 of the substrate 660 are electrically connected to each other by a direct joint between the metal wiring layer 623 and the metal wiring layer 673 in some region. For example, the metal wiring layer 623 in the uppermost layer and the metal wiring layer 673 in the uppermost layer may be electrically connected by Cu—Cu joint.

An n-type transistor (for example, the transfer transistor 206) for driving the light receiving element 205 formed in the substrate 610 is arranged on the side of the surface 652 of the substrate 610. P-type transistors (for example, the driving transistor 202 and the writing transistor 203) for driving the light emitting element 201 formed in an n-type well are arranged on the side of the surface 661 of the substrate 660. Each transistor may be a CMOS transistor formed by a general CMOS process. The thickness of a gate insulating film of the transistor such as the transfer transistor 206 of the light receiving circuit arranged in the substrate 610 and the thickness of a gate insulating film of the transistor such as the driving transistor 202 of the light emitting circuit arranged in the substrate 660 may be equal to each other, or may be different from each other. In order to form the transistors in the two substrates 610 and 660, each transistor is assigned to one of the two substrates 610 and 660 in accordance with a specification required for each transistor. With this, the transistors having different gate insulating film thicknesses can be easily formed.

In this embodiment, the transistors of the light receiving circuit for driving the light receiving element 205 are arranged in the substrate 610, and the transistors of the light emitting circuit for driving the light emitting element 201 are arranged in the substrate 660. However, the present invention is not limited to this. Some transistors forming the light emitting circuit may be arranged in the substrate 610, and some transistors forming the light receiving circuit may be arranged in the substrate 660. In accordance with specifications of the pixel 102 of the display apparatus 101 and specifications required for the respective transistors forming the light receiving circuit and the light emitting circuit, the respective components are distributed and arranged in the two substrates 610 and 660, as appropriate.

FIGS. 12A to 12C are plan views corresponding to one pixel 102 of the display apparatus 101 shown in FIG. 11. In practice, the layout shown in FIGS. 12A to 12C is periodically repeated at a predetermined pitch in the row direction and the column direction.

FIG. 12A shows an example of the plane arrangement of the light emitting circuit (the driving transistor 202, the writing transistor 203, and the capacitive element 204) for driving the light emitting element 201 arranged in the substrate 660. The driving transistor 202 is formed by including the gate electrode 502, the p-type diffusion layer 512 (drain), and the p-type diffusion layer 522 (source). The writing transistor 203 is formed by including the gate electrode 503, the p-type diffusion layer 513 (drain), and the p-type diffusion layer 523 (source). The capacitive element 204 is arranged so as to partially overlap the driving transistor 202 and the writing transistor 203 in an orthogonal projection with respect to the surface 661 of the substrate 660.

FIG. 12B shows an example of the plane arrangement of the light receiving element 205 and the light receiving circuit (the transfer transistor 206, the reset transistor 207, the amplification transistor 208, and the selection transistor 209) for driving the light receiving element 205, which are arranged in the substrate 610. The gate electrode 506 indicates the gate electrode of the transfer transistor 206, the gate electrode 507 indicates the gate electrode of the reset transistor 207, the gate electrode 508 indicates the gate electrode of the amplification transistor 208, and the gate electrode 509 indicates the gate electrode of the selection transistor 209.

In an orthogonal projection with respect to the surface 651 of the substrate 610, the electrode 501 of the light emitting element 201 and the light receiving element 205 at least partially overlap each other. By arranging the electrode 501 above the light receiving element 205, as in the respective arrangements described above, an influence of external light to the light receiving element 205 can be suppressed.

FIG. 12C shows a relationship obtained by overlapping the plan view of FIG. 12A and the plan view of FIG. 12B each other and stacking the respective elements. The capacitive element 204 of the light emitting circuit is arranged between the surface 652 of the substrate 610 and the surface 661 of the substrate 660. As shown in FIG. 12C, in the orthogonal projection with respect to the surface 651 of the substrate 610, the light receiving element 205 and the capacitive element 204 may at least partially overlap each other.

Light emitted by the light emitting element 201 includes a component which propagates to the outside (air) from the display apparatus 101, and a component which is reflected due to a reflective index difference between the light emitting layer 621 and the electrode 620 or between the electrode 620 and air (when a protection layer, a color filter, or the like exists on the electrode 620, between the electrode 620 and each layer) and returns to the light emitting layer 621 side. Part of the reflected component (reflected light) passes through a region where the electrode 501 and the light receiving element 205 do not overlap each other in the orthogonal projection with respect to the surface 651 of the substrate 610, and enters the light receiving element 205. Since the part of the reflected light corresponding to the luminance of the light emitting element 201 enters the light receiving element 205, a signal output corresponding to the luminance of the light emitting element 201 can be obtained from the light receiving element 205.

Also in the display apparatus 101 including the pixel 102 miniaturized by stacking the substrate 610 and the substrate 660 shown in FIGS. 11 and 12A to 12C, it is possible to obtain a signal corresponding to the light emitted by the light emitting element 201 while suppressing an influence of external light entering the light receiving element 205. That is, by using the structure of the pixel 102 shown in FIGS. 11 and 12A to 12C, it becomes possible to effectively perform correction of a deterioration of the light emitting element 201 and an uneven luminance in the surface of the pixel array 103. As a result, the image quality of a display image displayed on the display apparatus 101 can be improved.

Next, a modification of the pixel 102 shown in FIGS. 12A to 12C will be described using FIGS. 13A to 13C. When the occupied area of the light receiving circuit in the substrate 610 is compared to the occupied area of the light emitting circuit in the substrate 660, in the orthogonal projection with respect to the surface 651 of the substrate 610, the area occupied by the light receiving element 205 and the light receiving circuit can be larger than the area occupied by the light emitting circuit. This is because the light receiving element 205 requires a relatively large area. Therefore, reducing the number of the elements of the light receiving circuit functions effectively to reduce the area of the pixel 102.

Figure 13A:
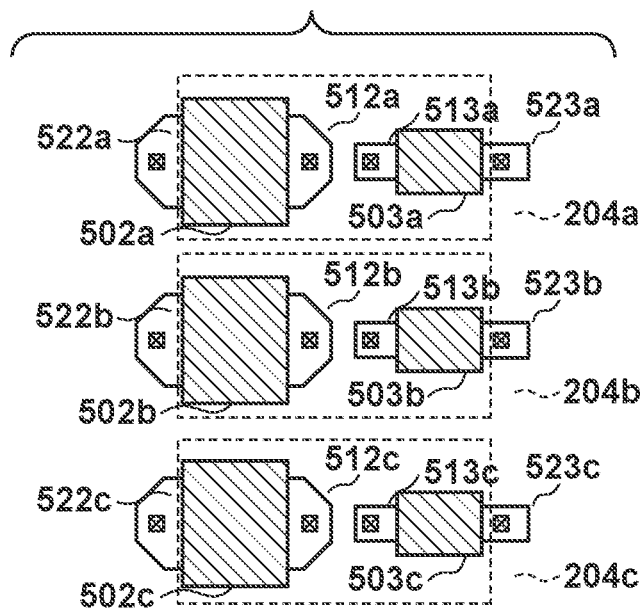
FIGS. 13A to 13C are plan views showing an arrangement example of the pixel of the display apparatus shown in FIG. 1.

FIG. 13A shows an example in which the light emitting circuit shown in FIG. 12A, which is used to drive the light emitting element 201, is shown for each of three elements (for example, a light emitting circuit for a red light emitting element, a light emitting circuit for a green light emitting element, and a light emitting circuit for a blue light emitting element). In this case, as shown in a plan view of FIG. 13B, light receiving elements 205a to 205c and transfer transistors 206a to 206c (shown as gate electrodes 506a to 506c in FIG. 13B) corresponding to the light receiving elements 205a to 205c, respectively, are arranged independently. On the other hand, by sharing the reset transistor 207, the amplification transistor 208, and the selection transistor 209 (shown as the gate electrodes 507 to 509, respectively, in FIG. 13B) after the capacitance 210 (floating diffusion capacitance) in the plurality of pixels 102, the area of the light receiving circuit can be reduced. FIG. 13C shows a relationship obtained by overlapping the plan view of FIG. 13A and the plan view of FIG. 13B each other and stacking the respective elements.

Figure 13B:
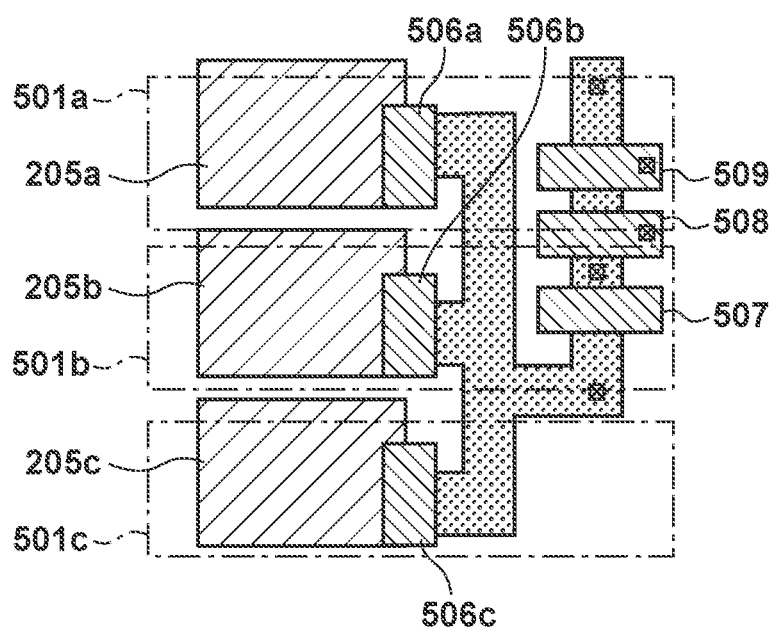
Figure 13C:
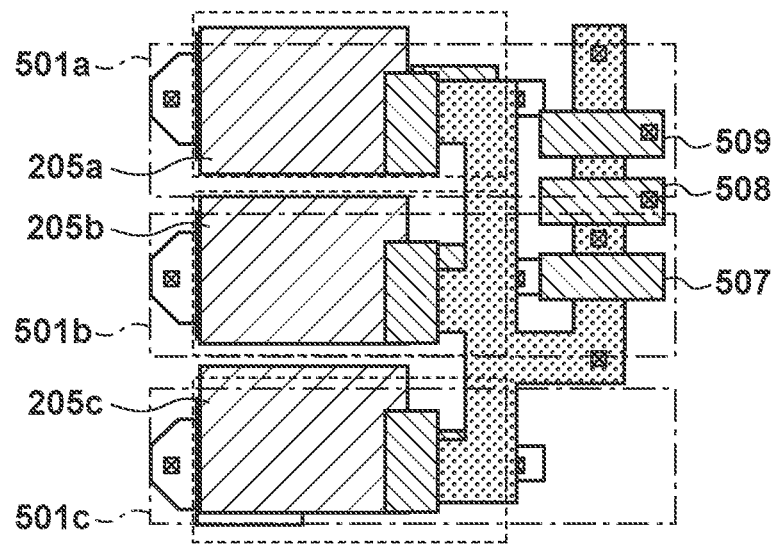

As has been described above, the light receiving elements 205 (the light receiving elements 205a to 205c in the arrangement shown in FIG. 13B) arranged in two or more pixels 102 may share a single light receiving circuit (the reset transistor 207, the amplification transistor 208, and the selection transistor 209 in the arrangement shown in FIG. 13B). Further, in this case, the two or more pixels 102 sharing the single light receiving circuit may be pixels that emit light of the same color, or may be pixels that emit light of different colors. Here, light emission of different colors may mean that the light emitting layers 621 themselves of the light emitting elements 201 emit light of different colors, respectively. Alternatively, the light emitting layers 621 emit light of the same color, but color filters or the like may be arranged on the light emitting layers 621. With this, the pixels 102 of the display apparatus 101 may emit light of different colors, respectively.

For the pixels 102 that emit light of different colors, the luminance ratio for achieving white balance changes in accordance with the color temperature. As the color temperature increases, the luminance of blue increases and the luminance of red decreases. When the color temperature is high, the luminance of red becomes lower than the luminances of other colors. Accordingly, the amount of signal charges accumulated in the light receiving element 205, which detects the luminance of red light, is small, so that the correction accuracy may decrease as compared to the other colors. In order to prevent this, the sensitivity of the light receiving element 205 corresponding to each color may be adjusted in accordance with the color temperature. The display apparatus 101 may include two or more (for example, three kinds including red light emission, green light emission, and blue light emission) pixels 102 that emit light of different colors, respectively, and the light receiving sensitivity of the light receiving element 205 arranged in a given pixel 102 may be different from the light receiving sensitivity of the light receiving element 205 arranged in the pixel that emit light of color different from that of the given pixel 102.

For example, in the pixels 102 having different light emission colors, the areas of the light receiving elements 205 may be different from each other. The area of the light receiving element 205 can be designed, as appropriate, in accordance with the designed white balance of the display apparatus 101. For the display apparatus 101 capable of white balance adjustment, by employing an arrangement in which the amplification ratio of an amplifier arranged in the readout circuit 106 can be adjusted as appropriate, the light receiving sensitivity of the light receiving element 205 can be changed. Particularly, by setting the sensitivities of the light receiving elements 205 in the reverse order of the light emission intensities of respective colors defined by the white balance, it is possible to prevent a decrease in correction accuracy for a deterioration of the light emitting element 201, an uneven luminance in the surface of the pixel array 103, and the like.

Next, another modification of the pixel 102 shown in FIGS. 12A to 12C will be described using FIGS. 14A to 14C. When the occupied area of the light receiving circuit in the substrate 610 is compared to the occupied area of the light emitting circuit in the substrate 660, the area occupied by the light receiving element 205 and the light receiving circuit can be larger than the area occupied by the light emitting circuit. Hence, in order to increase the resolution of the display apparatus 101, the repeating pitch of the light receiving circuit may be different from the repeating pitch of the light emitting circuit.

Figure 14A:
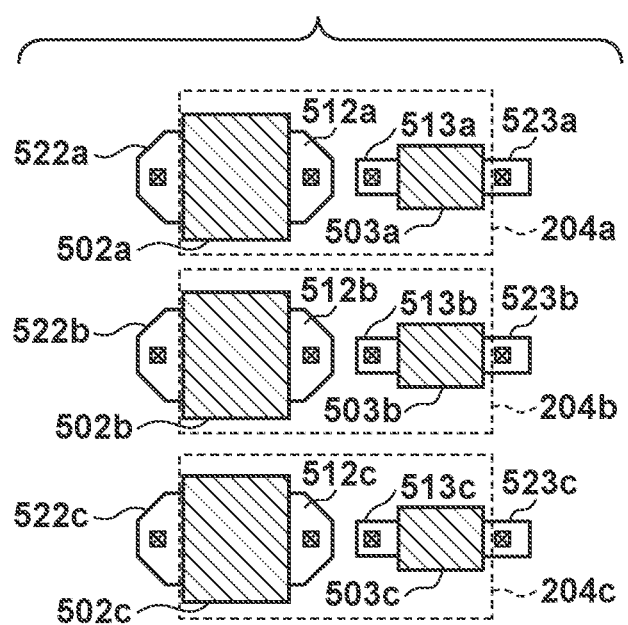
FIGS. 14A to 14C are plan views showing an arrangement example of the pixel of the display apparatus shown in FIG. 1.

FIG. 14A shows an example in which the light emitting circuit shown in FIG. 12A, which is used to drive the light emitting element 201, is shown for each of three elements (for example, a light emitting circuit for a red light emitting element, a light emitting circuit for a green light emitting element, and a light emitting circuit for a blue light emitting element). In this case, as shown in FIG. 14B, with respect to the light emitting circuits for driving the three light emitting elements 201, one light receiving element 205 and one light receiving circuit (the transfer transistor 206, the reset transistor 207, the amplification transistor 208, and the selection transistor 209 shown as the gate electrodes 506 to 509, respectively, in FIG. 14B) are arranged. That is, the plurality of pixels 102 may share one light receiving element 205 and one light receiving circuit. When the light receiving circuit and the light emitting circuit are arranged as described above, the repeating pitch of the light emitting circuit is different from the repeating pitch of the light receiving circuit. FIG. 14C shows a relationship obtained by overlapping the plan view of FIG. 14A and the plan view of FIG. 14B each other and stacking the respective elements.

Figure 14B:
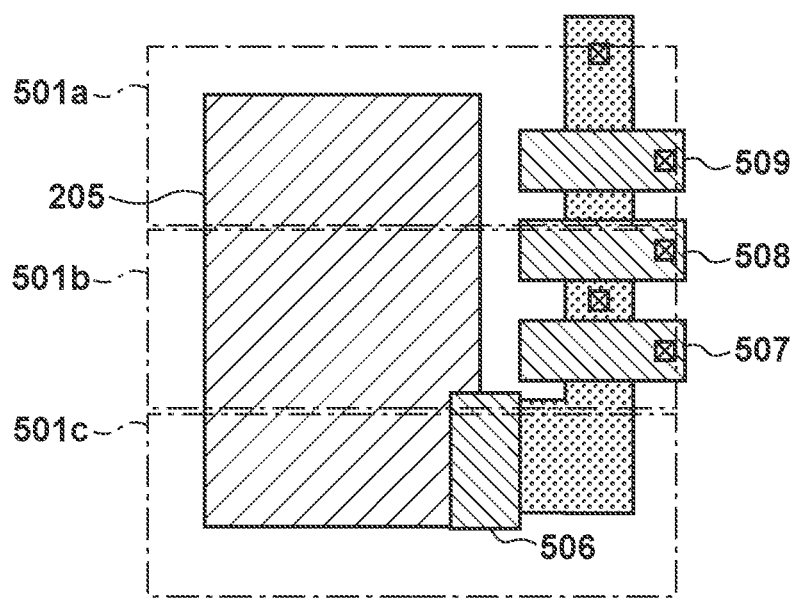
Figure 14C:
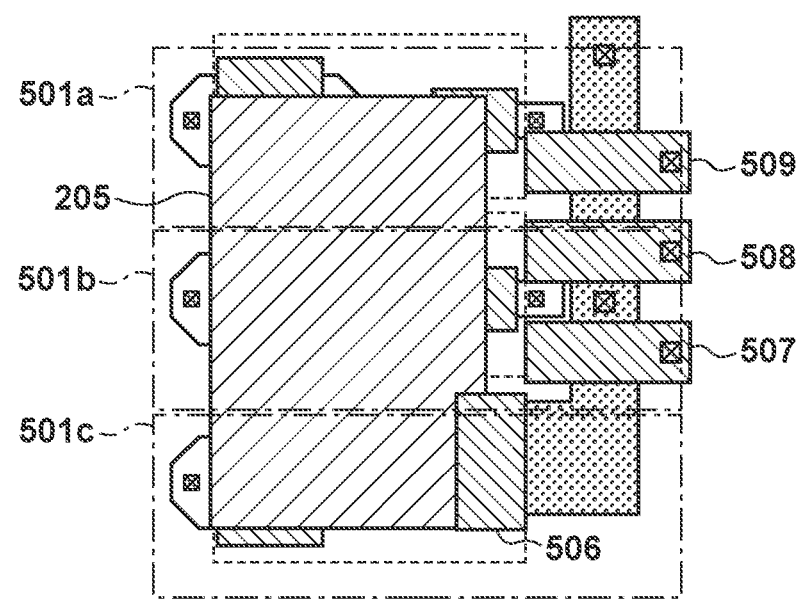

In the arrangement shown in FIGS. 14A to 14C, the single light receiving element 205 detects the luminances of the three light emitting elements 201. For example, when performing correction of a display image, a combined light amount of the three light emitting elements 201 is read out as a signal output (output image) from the light receiving circuit. Then, an image to be displayed and the output image are compared to calculate the difference therebetween. With this, correction data for a deterioration of each light emitting element 201 or the like can be obtained. Further, for example, when activating the display apparatus 101, the pixel 102 for a specific color is caused to emit light, and the luminance thereof is detected by the light receiving element 205. By repeating this operation for each color, the light emission amount with respect to input data to the light emitting element 201 of the pixel 102 can be acquired, and a correction coefficient for input data to the display apparatus 101 upon displaying an image can be acquired.

Here, if the luminance of light emission of the light emitting element 201 is extremely low, the incident light amount to the light receiving element is small. In this case, a problem can occur that the light receiving element is easily influenced by noise such as external light, so the sufficient correction accuracy cannot be maintained. Further, if the luminance of light emission of the light emitting element is low, an output signal of the light receiving element 205 rises slowly (the response speed decreases). Accordingly, a problem also occurs that the time until luminance measurement increases. If the measurement time by the light receiving element 205 is short, the light emission luminance may be measured before the light emitting element 201 reaches the light emission luminance corresponding to the input data. As a result, correction may not be performed correctly. A structure of the electrode 501 for solving the above-described problems will be described using FIG. 15.

Figure 15:
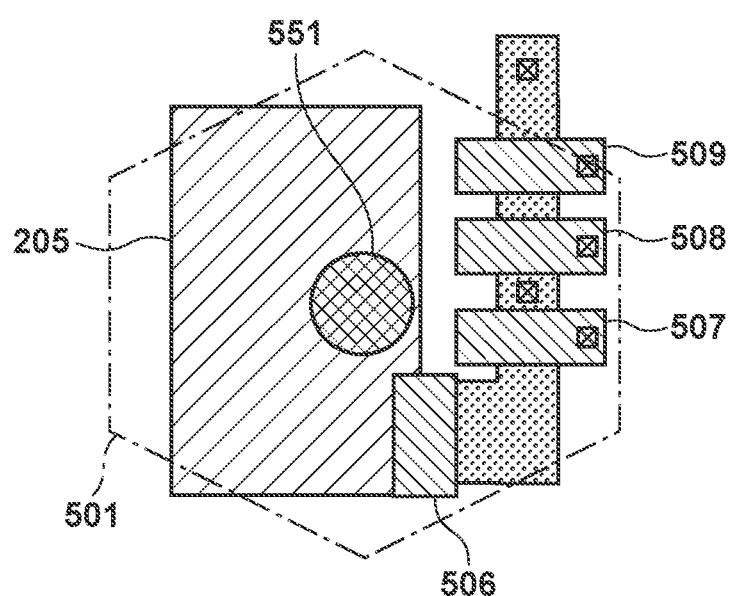
FIG. 15 is a plan view showing an arrangement example of the pixel of the display apparatus shown in FIG. 1.

In FIG. 15, an opening 551 is provided in the electrode 501 of the light emitting element 201 shown in the plan view of FIG. 12B. The opening 551 may be filled with a part of the light emitting layer 621 or a light transmissive member. When the light emitting element 201 emits light, part of the light emitted by the light emitting element 201 passes through the opening 551 and enters the light receiving element 205. Therefore, even when the luminance of the light emitting element 201 is low, the light amount entering the light receiving element 205 increases as compared to the electrode 501 shown in FIG. 12B. Thus, the accuracy of correction data can be maintained. Further, the light receiving sensitivity of the light receiving element 205 may be changed for each color described above by changing the size of the opening 551.

When the opening 551 is provided in the electrode 501 and filled with a part of the light emitting layer 621 or a light transmissive member as shown in FIG. 15, a step can be formed in a peripheral edge portion of the opening 551. If a disconnection or the like occurs in the light emitting layer 621 due to this step, this may affect the reliability of the display apparatus 101 (light emitting element 201). In order to decrease the step formed in the peripheral edge portion of the opening 551, the electrode 501 may have a stacked structure of a transparent electrode and a light shielding film such as a metal layer in which the opening 551 is provided. The metal layer functions as a light shielding film even when the film thickness is relatively small. For example, by stacking a transparent electrode on the metal layer so as to achieve a predetermined resistance value, the step of the opening 551 can be decreased.

Alternatively, a structure may be employed in which no opening 551 is provided but a material that transmits at least part of the light emitted by the light emitting element 201 is used as the electrode 501. That is, the electrode 501 may transmit part of the light generated in the light emitting layer. A metal oxide such as tin oxide, zinc oxide, indium oxide, indium tin oxide (ITO), or zinc indium oxide can be used as a transparent material that can be employed as the electrode 501, but the present invention is not limited to this.

In order to obtain information used to correct a deterioration of the light emitting element 201 or the like while preventing a decrease in light amount emitted from the display apparatus 101 and an influence of external light, the light transmittance of the electrode 501 is not necessarily a high transmittance but may be a relatively low transmittance. For example, the light transmittance of the electrode 501 may be 20% or less, or may be 10% or less. For the display apparatus 101 having a luminance of about 500 cd/m$^2$, if the light transmittance of the electrode 501 is 1% or more, information required for correction of the light emitting element 201 can be obtained without being buried in noise of the light receiving element 205. That is, the transmittance of the electrode 501 to light generated in the light emitting layer 621 may be 1% or more and 20% or less.

As has been described above using FIGS. 12A to 15, by using the stacked structure of the substrates 610 and 660, while suppressing an influence of external light, it is possible to reduce (miniaturize) the area of the pixel 102 as compared to a case of using the single substrate 610. As a result, increasing the resolution of the display apparatus 101 can be achieved.

Here, an actual application example of the display apparatus 101 of this embodiment, and examples in which the display apparatus 101 is applied to a photoelectric conversion apparatus, an electronic equipment, an illumination apparatus, a moving body, and a wearable device will be described using FIGS. 16 to 22B. In addition, the display apparatus 101 is applicable to the exposure light source of an electrophotographic image forming apparatus, the backlight of a liquid crystal display apparatus, a light emitting device including a color filter in a white light source, and the like. The display apparatus 101 may be an image information processing apparatus that includes an image input unit for inputting image information from an area CCD, a linear CCD, a memory card, or the like, and an information processing unit for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display apparatus may be used for the display unit of a multifunction printer.

Figure 16:
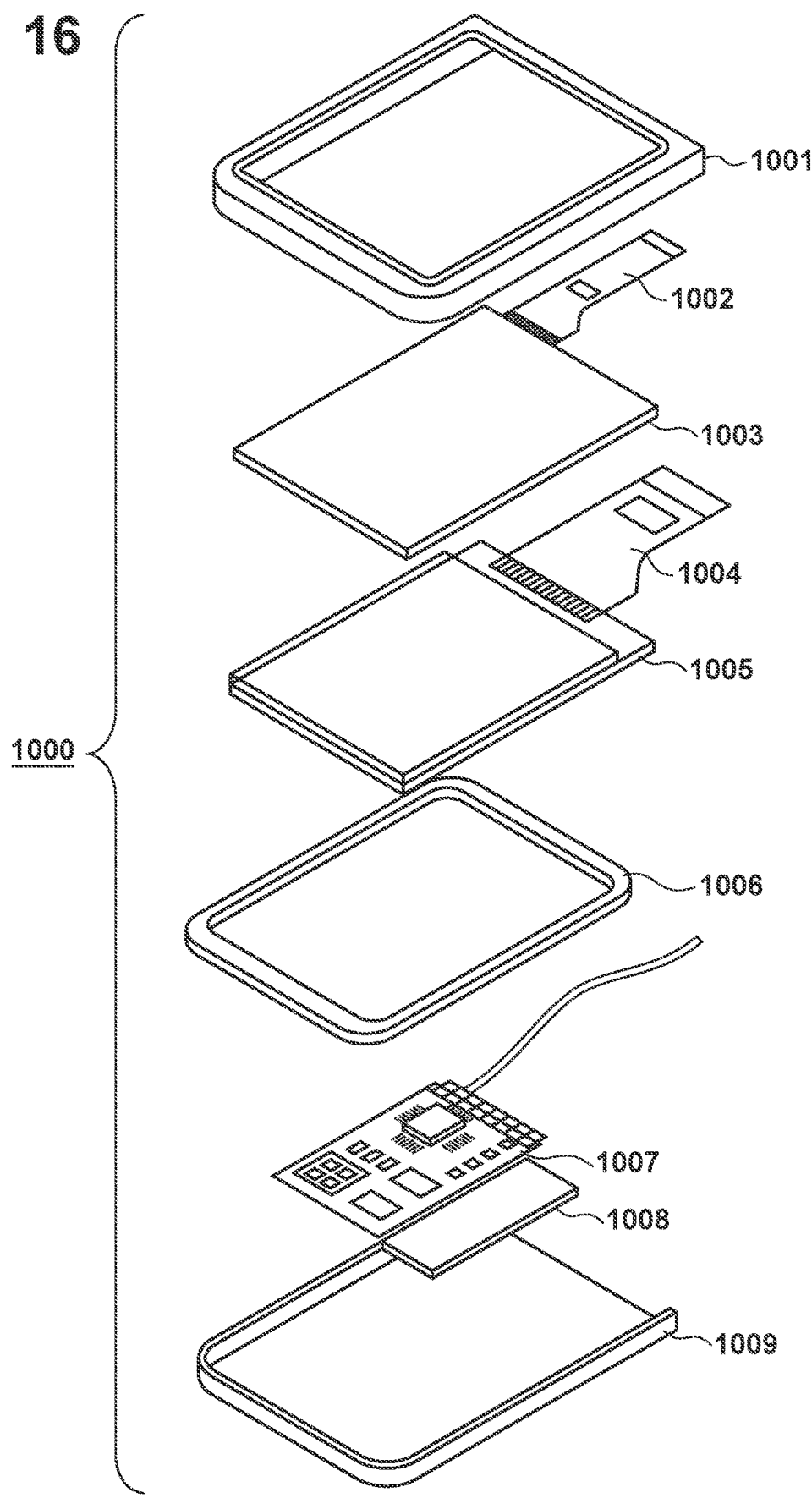
FIG. 16 is a view showing an application example of the display apparatus of the embodiment.

FIG. 16 is a schematic view showing an application example of a display apparatus using the display apparatus 101 of this embodiment. A display apparatus 1000 may include, between an upper cover 1001 and a lower cover 1009, a touch panel 1003, a display panel 1005, a frame 1006, a circuit board 1007, and a battery 1008. The touch panel 1003 and the display panel 1005 are connected to flexible printed circuit FPCs 1002 and 1004, respectively. Active elements such as transistors are arranged on the circuit board 1007. The battery 1008 may not be provided if the display apparatus 1000 is not a portable device, or need not be provided in this position even if the display apparatus is a portable device. The pixel array 103 of the display apparatus 101 described above can be applied to the display panel 1005. The display apparatus 101 functioning as the display panel 1005 is connected to the active element such as the transistor arranged on the circuit board 1007 to be operated. For example, the circuit board 1007 may correspond to the respective components of the above-described driving circuit.

The display apparatus 1000 shown in FIG. 16 may be used for the display unit of a photoelectric conversion apparatus (image capturing apparatus) that includes an optical unit including a plurality of lenses and an image sensor that receives light having passed through the optical unit and photoelectrically converts the light into an electric signal. The photoelectric conversion apparatus may include a display unit which displays information acquired by the image sensor. The display unit may be a display unit exposed to the outside of the photoelectric conversion apparatus, or a display unit arranged in a viewfinder. The photoelectric conversion apparatus may be a digital camera or a digital video camera.

Figure 17:
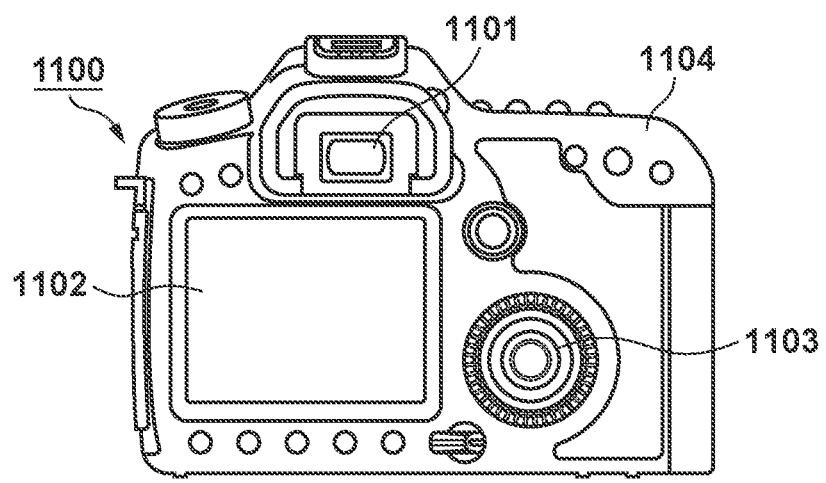
FIG. 17 is a view showing an example of a photoelectric conversion apparatus using the display apparatus of the embodiment.

FIG. 17 is a schematic view showing an example of a photoelectric conversion apparatus using the display apparatus 101 of this embodiment. A photoelectric conversion apparatus 1100 may include a viewfinder 1101, a rear display 1102, an operation unit 1103, and a housing 1104. The photoelectric conversion apparatus 1100 can be referred to as an image capturing apparatus. The display apparatus 101 described above can be applied to the viewfinder 1101 serving as the display unit. In this case, the display apparatus 101 may display not only an image to be captured, but also environment information, an image capturing instruction, and the like. The environment information may include the intensity of ambient light, the direction of ambient light, the moving speed of an object, the possibility that the object is blocked by a shielding object, or the like.

Since the timing suitable for capturing an image is often a short time, it is better to display the information as quickly as possible. Therefore, the display apparatus 101 including an organic light emitting material such as an organic EL element as the light emitting element 201 can be used in the viewfinder 1101. This is because the organic light emitting material has a high response speed. The display apparatus 101 using the organic light emitting material can be used more suitably than a liquid crystal display apparatus in the apparatuses that require a high display speed.

The photoelectric conversion apparatus 1100 includes an optical unit (not shown). The optical unit includes a plurality of lenses and forms an image on a photoelectric conversion element (not shown), which receives light having passed through the optical unit, housed in the housing 1104. It is possible to adjust the focus by adjusting the relative positions of the plurality of lenses. This operation can be performed automatically.

The display apparatus 101 may be applied to the display unit of an electronic equipment. In this case, the display unit may have both a display function and an operation function. Examples of the mobile terminal include a mobile phone such as a smartphone, a tablet, and a head mounted display.

Figure 18:
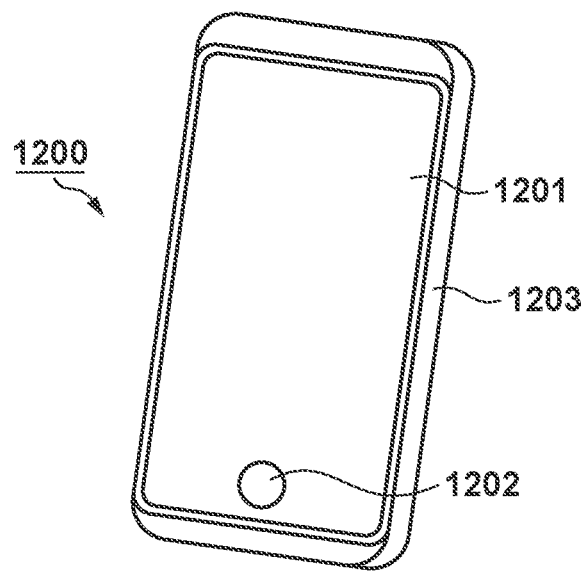
FIG. 18 is a view showing an example of an electric equipment using the display apparatus of the embodiment.

FIG. 18 is a schematic view showing an example of an electronic equipment using the display apparatus 101 of this embodiment.

An electronic equipment 1200 includes a display unit 1201, an operation unit 1202, and a housing 1203. The housing 1203 may include a circuit, a printed board including the circuit, a battery, and a communication unit. The operation unit 1202 may be a button or a touch panel type sensing unit. The operation unit 1202 may be a biometrics unit that recognizes a fingerprint and releases a lock or the like. A portable device including a communication unit can also be called a communication equipment. The above-described display apparatus 101 can be applied to the display unit 1201.

Figure 19A:
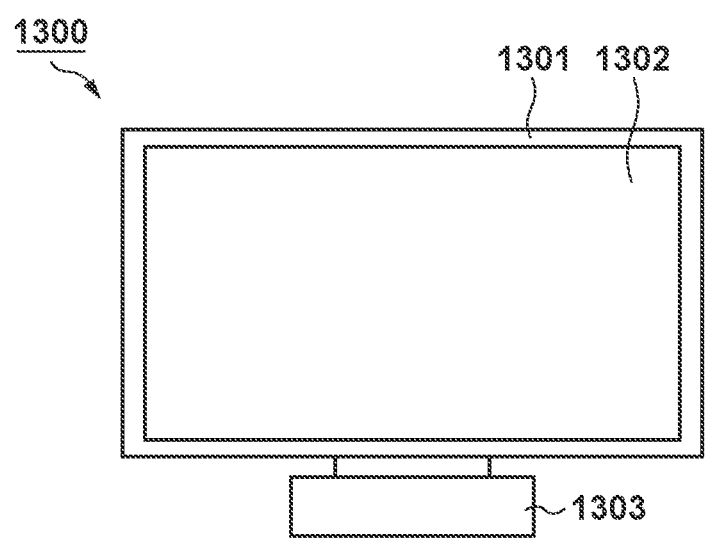
FIGS. 19A and 19B are views each showing an application example of the display apparatus of the embodiment.
Figure 19B:
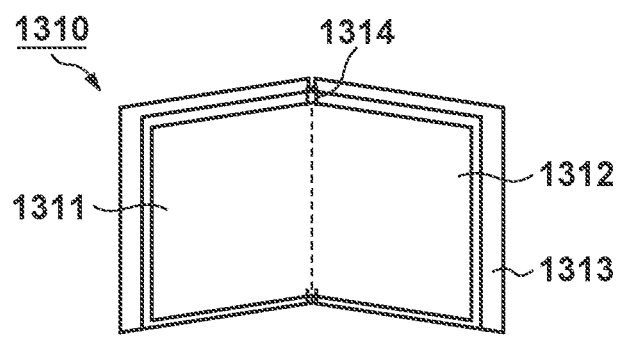

FIGS. 19A and 19B are schematic views each showing an application example of a display apparatus using the display apparatus 101 of this embodiment. FIG. 19A shows a display apparatus such as a television monitor or a PC monitor. A display apparatus 1300 includes a frame 1301 and a display unit 1302. The pixel array 103 of the display apparatus 101 described above can be applied to the display unit 1302. The display apparatus 1300 may include a base 1303 that supports the frame 1301 and the display unit 1302. The base 1303 is not limited to the form shown in FIG. 19A. For example, the lower side of the frame 1301 may serve as the base 1303. The frame 1301 and the display unit 1302 may be bent. The curvature radius may be between 5,000 mm (inclusive) and 6,000 mm (inclusive).

FIG. 19B is a schematic view showing another application example of the display apparatus using the display apparatus 101 of this embodiment. A display apparatus 1310 shown in FIG. 19B is configured to be bendable, and is a so-called foldable display apparatus. The display apparatus 1310 includes a first display unit 1311, a second display unit 1312, a housing 1313, and a bending point 1314. The pixel array 103 of the display apparatus 101 described above can be applied to each of the first display unit 1311 and the second display unit 1312. The first display unit 1311 and the second display unit 1312 may be one seamless display apparatus. The first display unit 1311 and the second display unit 1312 can be divided at the bending point. The first display unit 1311 and the second display unit 1312 may display different images, or one image may be displayed with the first display unit and the second display unit.

Figure 20:
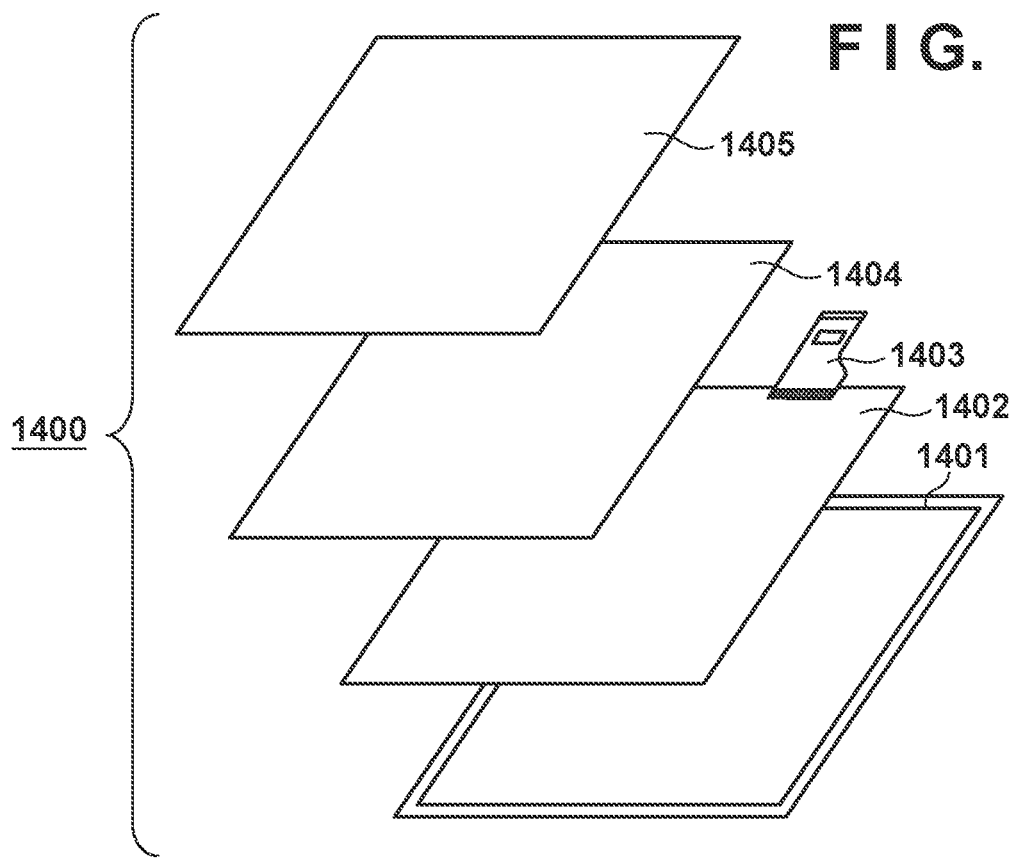
FIG. 20 is a view showing an example of an illumination apparatus using the display apparatus of the embodiment.

FIG. 20 is a schematic view showing an example of an illumination apparatus using the display apparatus 101 of this embodiment. An illumination apparatus 1400 may include a housing 1401, a light source 1402, a circuit board 1403, an optical film 1404, and a light diffusion unit 1405. The above-described display apparatus 101 can be applied to the light source 1402. The optical film 1404 may be a filter that improves the color rendering property of the light source. The light diffusion unit 1405 can effectively diffuse light from the light source to illuminate a wide range for lighting up or the like. A cover may be provided in the outermost portion, as needed. The illumination apparatus 1400 may include both the optical film 1404 and the light diffusion unit 1405, or may include only one of them.

The illumination apparatus 1400 is, for example, an apparatus that illuminates a room. The illumination apparatus 1400 may emit light of white, day white, or any other color from blue to red. The illumination apparatus 1400 may include a light control circuit for controlling the light color. The illumination apparatus 1400 may include a power supply circuit connected to the display apparatus 101 which functions as the light source 1402. The power supply circuit is a circuit that converts an AC voltage into a DC voltage. Note that white light has a color temperature of 4200K, and day-white light has a color temperature of 5000K. The illumination apparatus 1400 may also include a color filter.

Further, the illumination apparatus 1400 may include a heat dissipation portion. The heat dissipation portion releases the heat in the apparatus to the outside of the apparatus, and examples thereof include a metal having high specific heat, liquid silicon, and the like.

Figure 21:
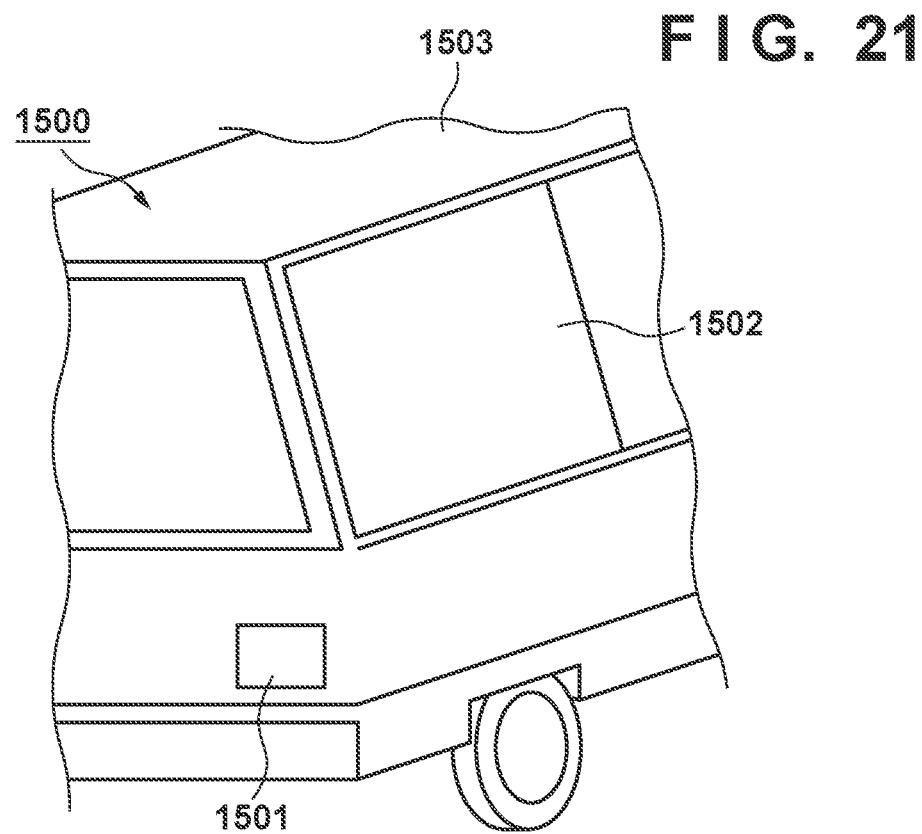
FIG. 21 is a view showing an example of a moving body using the display apparatus of the embodiment.

FIG. 21 is a schematic view showing an automobile including a tail lamp which is an example of the lighting unit for an automobile using the display apparatus 101 of this embodiment. An automobile 1500 includes a tail lamp 1501, and may turn on the tail lamp 1501 when a brake operation or the like is performed. The display apparatus 101 of this embodiment may be used in a head lamp as the lighting unit for an automobile. The automobile is an example of a moving body, and the mobile body may be a ship, a drone, an aircraft, a railroad car, an industrial robot, or the like. The moving body may include a main body and a lighting unit provided in the main body. The lighting unit may inform the current position of the body.

The above-described display apparatus 101 can be applied to the tail lamp 1501. The tail lamp 1501 may include a protective member that protects the display apparatus 101 which functions as the tail lamp 1501. The protective member has a certain degree of strength, and can be made from any material as long as it is transparent. The protective member may be made from polycarbonate or the like. Further, the protective member may be made from polycarbonate mixed with furandicarboxylic acid derivative, acrylonitrile derivative, or the like.

The automobile 1500 may include a body 1503 and windows 1502 attached thereto. The window may be a window for checking the front or rear of the automobile, or may a transparent display. The above-described display apparatus 101, in which the light emitting layer 621 includes an organic light emitting material and functions as a light emitting apparatus, may be used in the transparent display. In this case, the components such as the electrodes included in the display apparatus 101 are formed by transparent members.

Application examples of the display apparatus 101 according to the embodiments described above will be described with reference to FIGS. 22A and 22B. The display apparatus 101 is applicable to, for example, a system that can be worn as a wearable device such as smart glasses, an HMD (Head Mount Display), smart contact lenses, or the like. An image capturing display device that is used in such an application example includes an image capturing apparatus that can photoelectrically convert visible light and a light emitting apparatus that can emit visible light.

Figure 22A:
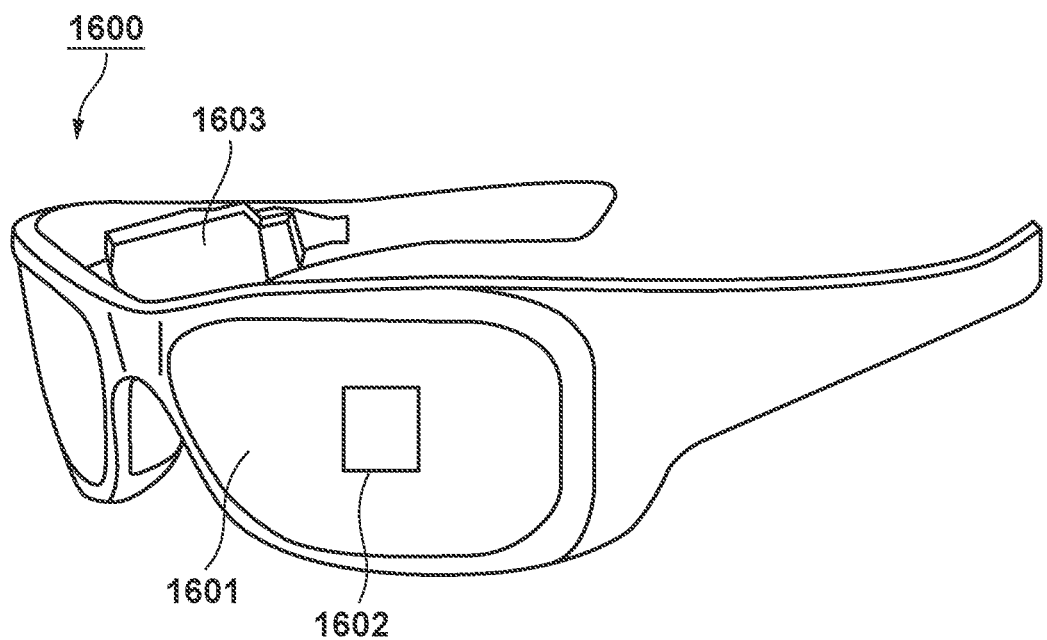
FIGS. 22A and 22B are views each showing an example of a wearable device using the display apparatus of the embodiment.

FIG. 22A illustrates a pair of glasses 1600 (smart glasses) according to an application example. An image capturing apparatus 1602 such as a CMOS sensor or an SPAD is arranged on the front surface side of a lens 1601 of the glasses 1600. Also, the display apparatus 101 of each embodiment described above is arranged on the back surface side of the lens 1601.

The pair of glasses 1600 further includes a control apparatus 1603. The control apparatus 1603 functions as a power supply that supplies power to the image capturing apparatus 1602 and the display apparatus 101 according to the embodiments. The control apparatus 1603 controls the operation of the image capturing apparatus 1602 and the operation of the display apparatus 101. An optical system for focusing light to the image capturing apparatus 1602 is formed on the lens 1601.

Figure 22B:
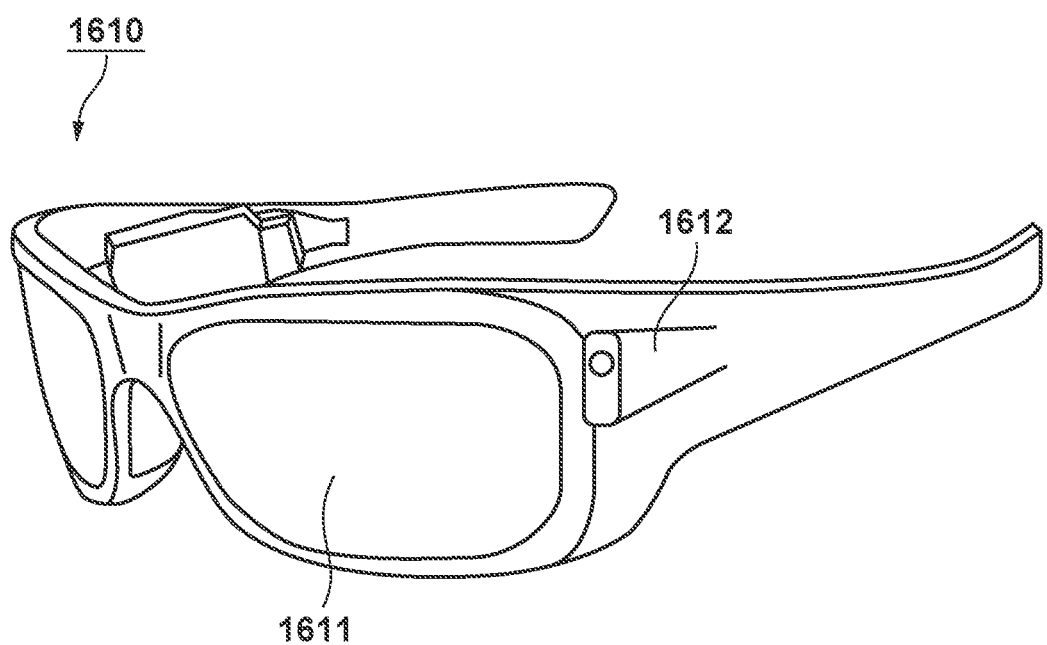

FIG. 22B illustrates a pair of glasses 1610 (smart glasses) according to another application example. The pair of glasses 1610 includes a control apparatus 1612, and an image capturing apparatus corresponding to the image capturing apparatus 1602 and the display apparatus 101 are incorporated in the control apparatus 1612. An optical system for projecting light emitted from the image capturing apparatus and the display apparatus 101 in the control apparatus 1612 is formed in a lens 1611, and an image is projected onto the lens 1611. In addition to functioning as a power supply that supplies power to the image capturing apparatus and the display apparatus 101, the control apparatus 1612 also controls the operation of the image capturing apparatus and the operation of the display apparatus 101. The control apparatus 1612 may include a line-of-sight detection unit that detects the line of sight of a wearer. Infrared light can be used for the line-of-sight detection. An infrared light emitting unit emits infrared light to the eyeball of a user who is gazing at a displayed image. When the emitted infrared light is reflected by the eyeball and detected by an image capturing unit including a light receiving element, a captured image of the eyeball can be obtained. Image quality degradation is reduced by providing a reduction means that reduces the light from the infrared light emitting unit to the display unit in a planar view.

The line of sight of the user to the displayed image is detected from the captured image of the eyeball obtained by the image capturing operation using the infrared light. A known method can be arbitrarily applied for the line-of-sight detection using the captured eyeball image. As an example, a line-of-sight detection method based on Purkinje images caused by the reflection of the emitted light on the cornea can be used.

More specifically, line-of-sight detection processing is performed based on a pupil-cornea reflection method. The line of sight of the user is detected by using the pupil-cornea reflection method to calculate a line-of-sight vector representing the direction (rotation angle) of the eyeball based on the image of the pupil and the Purkinje images included in the captured image of the eyeball.

The display apparatus 101 according to this embodiment may include an image capturing apparatus including a light receiving element, and control a displayed image based on the line-of-sight information of the user obtained from the image capturing apparatus.

More specifically, in the display apparatus 101, a first field-of-view region which is gazed by the user and a second field-of-view region other than the first field-of-view region are determined based on the line-of-sight information.

The first field-of-view region and the second field-of-view region may be determined by a control apparatus of the display apparatus 101. Alternatively, the first field-of-view region and the second field-of-view region may be determined by an external control apparatus and the display apparatus 101 may receive information corresponding to this determination. Control can be performed in the display region of the display apparatus 101 so that the display resolution of the first field-of-view region will be higher than the display resolution of the second field-of-view region. That is, the resolution of the second field-of-view region may be lowered more than the resolution of the first field-of-view region.

In addition, the display region includes a first display region and a second display region different from the first display region, and a region with a high degree of priority is determined from the first display region and the second display region of the display region based on the line-of-sight information. The first field-of-view region and the second field-of-view region may be determined by the control apparatus of the display apparatus 101. Alternatively, the first field-of-view region and the second field-of-view region may be determined by an external control apparatus and the display apparatus 101 may receive information corresponding to this determination. Control may be performed so that the resolution of a region with the high degree of priority will be set higher than the resolution of a region other than the region with the high degree of priority. That is, the resolution of a region with a relatively low degree of priority may be set low.

Note that an AI may be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed by the eyeball of the image as the teaching data. The display apparatus 101, the image capturing apparatus, or an external apparatus may include the AI program. If the AI program is included in an external apparatus, information determined by the AI program will be transmitted to the display apparatus 101 by communication.

In a case in which display control is to be performed based on visual recognition detection, the display apparatus 101 can be applied to a pair of smart glasses that further includes an image capturing apparatus configured to capture the outside. The smart glasses can display the captured outside information in real time.

According to the present invention, it is possible to provide a technique advantageous in detecting the luminance of a light emitting element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-138252, filed Aug. 26, 2021, which is hereby incorporated by reference herein in its entirety.

What is claimed is:

1. A display apparatus comprising a substrate in which a plurality of pixels are arranged,
   wherein each of the plurality of pixels comprises a light emitting element arranged above a first surface of the substrate, and a light receiving element arranged between the first surface and a second surface of the substrate on an opposite side of the first surface,
   wherein the light emitting element comprises a first electrode, a second electrode arranged between the first surface and the first electrode, and a light emitting layer arranged between the first electrode and the second electrode,
   wherein in an orthogonal projection with respect to the first surface, the second electrode and the light receiving element at least partially overlap each other,
   wherein the second electrode transmits part of light generated in the light emitting layer, and
   wherein a transmittance of the second electrode to light generated in the light emitting layer is not less than 1% and not more than 20%.

2. The apparatus according to claim 1, wherein in an orthogonal projection with respect to a third surface orthogonal to the first surface, the light emitting element and the light receiving element do not overlap each other.

3. The apparatus according to claim 1, wherein an opening is provided in the second electrode.

4. The apparatus according to claim 3, wherein the opening is filled with a part of the light emitting layer or a light transmissive member.

5. The apparatus according to claim 3, wherein the second electrode has a stacked structure of a transparent electrode and a light shielding film in which the opening is provided.

6. The apparatus according to claim 1, wherein the plurality of pixels comprise a first pixel and a second pixel which emit light of different colors, respectively, and
   wherein a light receiving sensitivity of the light receiving element arranged in the first pixel and a light receiving sensitivity of the light receiving element arranged in the second pixel are different from each other.

7. The apparatus according to claim 6, wherein in the orthogonal projection with respect to the first surface, an area of the light receiving element arranged in the first pixel and an area of the light receiving element arranged in the second pixel are different from each other.

8. The apparatus according to claim 1, wherein (1) a light emitting circuit configured to drive the light emitting element and (2) a light receiving circuit configured to drive the light receiving element are further arranged in the substrate.

9. The apparatus according to claim 8, wherein the light emitting circuit comprises a capacitive element configured to hold a luminance signal corresponding to a luminance of light emission of the light emitting element, and
   wherein in the orthogonal projection with respect to the first surface, the light receiving element and the capacitive element do not overlap each other.

10. The apparatus according to claim 8, wherein an interlayer insulating film is arranged between the first surface and the first electrode, and
    wherein in the orthogonal projection with respect to the first surface, a light shielding layer is arranged in a region of the interlayer insulating film which overlaps an outer edge portion of each of the plurality of pixels.

11. The apparatus according to claim 10, wherein in the orthogonal projection to the first surface, an optical waveguide is arranged in a region of the interlayer insulating film which overlaps the light receiving element.

12. The apparatus according to claim 8, wherein an interlayer insulating film is arranged between the first surface and the first electrode, and
    wherein in the orthogonal projection with respect to the first surface, an optical waveguide is arranged in a region of the interlayer insulating film which overlaps the light receiving element.

13. A photoelectric conversion apparatus comprising:
    an optical unit comprising a plurality of lenses;
    an image sensor configured to receive light having passed through the optical unit; and
    a display unit configured to display an image,
    wherein the display unit is configured to display an image captured by the image sensor, and comprises the display apparatus according to claim 1.

14. An electric equipment comprising:
    a housing provided with a display unit; and
    a communication unit provided in the housing and configured to communicate with the outside,
    wherein the display unit comprises the display apparatus according to claim 1.

15. An illumination apparatus comprising a light source and at least one of a light diffusion unit and an optical film,
    wherein the light source comprises the display apparatus according to claim 1.

16. A moving body comprising a main body and a lighting unit provided in the main body, wherein the lighting unit comprises the display apparatus according to claim 1.

17. A wearable device comprising a display device configured to display an image,
wherein the display device comprises the display apparatus according to claim 1.

18. A display apparatus comprising a substrate in which a plurality of pixels are arranged,
wherein each of the plurality of pixels comprises a light emitting element arranged above a first surface of the substrate, and a light receiving element arranged between the first surface and a second surface of the substrate on an opposite side of the first surface,
wherein the light emitting element comprises a first electrode, a second electrode arranged between the first surface and the first electrode, and a light emitting layer arranged between the first electrode and the second electrode,
wherein in an orthogonal projection with respect to the first surface, the second electrode and the light receiving element at least partially overlap each other,
wherein the substrate is a first substrate, and a second substrate arranged so as to face the second surface is further comprised,
wherein at least a part of a light receiving circuit configured to drive the light receiving element is arranged in the first substrate, and
wherein at least a part of a light emitting circuit configured to drive the light emitting element is arranged in the second substrate,
wherein the light emitting circuit comprises a capacitive element configured to hold a luminance signal corresponding to a luminance of light emission of the light emitting element,
wherein the capacitive element is arranged between the second surface and the second substrate, and
wherein in the orthogonal projection with respect to the first surface, the light receiving element and the capacitive element at least partially overlap each other.

19. The apparatus according to claim 18, wherein the second electrode transmits part of light generated in the light emitting layer.

20. The apparatus according to claim 19, wherein a transmittance of the second electrode to light generated in the light emitting layer is not less than 1% and not more than 20%.

21. The apparatus according to claim 18, wherein in the orthogonal projection with respect to the first surface, an area occupied by the light receiving element and the light receiving circuit is larger than an area occupied by the light emitting circuit.

22. The apparatus according to claim 18, wherein a thickness of a gate insulating film of a transistor of the light receiving circuit arranged in the first substrate and a thickness of a gate insulating film of a transistor of the light emitting circuit arranged in the second substrate are different from each other.

23. The apparatus according to claim 18, wherein the plurality of pixels comprise a third pixel and a fourth pixel, and
wherein the light receiving element arranged in the third pixel and the light receiving element arranged in the fourth pixel share the single light receiving circuit.

24. The apparatus according to claim 18, wherein the plurality of pixels comprise a third pixel and a fourth pixel, and
wherein the third pixel and the fourth pixel share the single light receiving element.

25. The apparatus according to claim 23, wherein the third pixel and the fourth pixel emit light of different colors, respectively.

* * * * *